(12) United States Patent
Devriendt et al.

(10) Patent No.: US 11,281,531 B2
(45) Date of Patent: Mar. 22, 2022

(54) SERIAL STORAGE NODE PROCESSING OF DATA FUNCTIONS

(71) Applicant: Western Digital Technologies, Inc., San Jose, CA (US)

(72) Inventors: Stijn Devriendt, Knesselare (BE); Thomas Demoor, De Haan (BE); Ewan Higgs, Ghent (BE)

(73) Assignee: Western Digital Technologies, Inc., San Jose, CA (US)

( * ) Notice: Subject to any disclaimer, the term of this patent is extended or adjusted under 35 U.S.C. 154(b) by 71 days.

(21) Appl. No.: 16/451,891

(22) Filed: Jun. 25, 2019

(65) Prior Publication Data

US 2020/0409791 A1    Dec. 31, 2020

(51) Int. Cl.
*G06F 11/00* (2006.01)
*G06F 11/10* (2006.01)
*H04L 67/01* (2022.01)

(52) U.S. Cl.
CPC ...... *G06F 11/1076* (2013.01); *G06F 11/1048* (2013.01); *H04L 67/42* (2013.01)

(58) Field of Classification Search
CPC .. G06F 11/1076; G06F 11/1048; H04L 67/42; H03M 13/373; H03M 13/455
USPC ....................................... 714/776, 770, 780
See application file for complete search history.

(56) References Cited

U.S. PATENT DOCUMENTS

| | | | |
|---|---|---|---|
| 7,650,331 B1 * | 1/2010 | Dean ..................... | G06F 9/5066 712/203 |
| 9,225,675 B2 | 12/2015 | Patiejunas et al. | |
| 9,582,355 B2 | 2/2017 | Luby | |
| 9,595,979 B2 | 3/2017 | Blaum et al. | |
| 2015/0067243 A1 * | 3/2015 | Salessi ..................... | G06F 16/28 711/103 |
| 2015/0254287 A1 * | 9/2015 | Tateiwa .............. | G06F 16/9574 707/755 |
| 2015/0304420 A1 * | 10/2015 | Li ........................... | H04L 67/02 709/201 |
| 2016/0011936 A1 * | 1/2016 | Luby ....................... | G06F 3/067 714/6.2 |
| 2016/0011939 A1 * | 1/2016 | Luby ................... | G06F 11/1088 714/764 |
| 2016/0026543 A1 * | 1/2016 | Tian .................... | G06F 11/1076 714/4.11 |
| 2016/0188407 A1 | 6/2016 | Bronnikov et al. | |
| 2016/0380650 A1 * | 12/2016 | Calder ................ | H03M 13/154 714/766 |

(Continued)

OTHER PUBLICATIONS

Chen, Yuanqi et. al., aHDFS: An Erasure-Coded Data Archival System for Hadoop Clusters, May 19, 2017, https://ieeexplore.ieee.org/document/7932189.

(Continued)

*Primary Examiner* — Albert Decady
*Assistant Examiner* — Osman M Alshack
(74) *Attorney, Agent, or Firm* — Patent Law Works LLP

(57) ABSTRACT

Example storage systems, storage nodes, and methods provide storage node processing of data functions, such as serial functions. Storage nodes are configured to partition decode erasure encoded symbols, identify subunits of a data unit from the decoded symbols, process the subunits using a serial function to generate intermediate contexts, and send the intermediate context to a next storage node for continued processing using the serial function.

20 Claims, 17 Drawing Sheets

(56) References Cited

U.S. PATENT DOCUMENTS

| | | | |
|---|---|---|---|
| 2017/0033892 A1* | 2/2017 | Luby | H04L 1/0064 |
| 2017/0048021 A1 | 2/2017 | Yanovsky et al. | |
| 2017/0060683 A1* | 3/2017 | Luby | G06F 3/067 |
| 2017/0083416 A1* | 3/2017 | Richardson | G06F 11/2094 |
| 2017/0083603 A1* | 3/2017 | Minder | G06F 16/285 |
| 2017/0213047 A1* | 7/2017 | Huang | G06F 3/0623 |
| 2017/0272209 A1* | 9/2017 | Yanovsky | H04L 67/1097 |
| 2017/0308434 A1* | 10/2017 | Cronie | H04L 67/1097 |
| 2018/0039543 A1* | 2/2018 | Luby | G06F 3/064 |
| 2018/0060169 A1 | 3/2018 | Hussain et al. | |
| 2019/0034087 A1 | 1/2019 | Renauld et al. | |

OTHER PUBLICATIONS

Dean, Jeffery et. al., MapReduce: Simple Data Processing on Large Clusters, ACM Digital Library, Jan. 2008, https://dl.acm.org/doi/abs/10.1145/1327452.1327492.

Li, Runhui et. al., Degraded-First Scheduling for MapReduce in Erasure-Coded Storage Clusters, 2014 44th Annual IEEE/IFIP Intl. Conferene on Dependable Systems and Networks, Sep. 22, 2014, https://ieeexplore.ieee.org/document/6903599/references#references, p. 419-430.

Srivastava, Tavish, Introduction to MapReduce, May 28, 2014, Analytics Vidhya, https://www.analyticsvidhya.com.

Tutorials Point, MapReduce—Introduction, Apr. 14, 2017, https://web.archive.org/web/20170414042032/https://www.tutorialspoint.com/map_reduce/map_reduce_introduction.htm.

Li, "Making MapReduce Scheduling Effective in Erasure-Coded Storage Clusters," The Chinese University of Hong Kong, Aug. 11, 2017, available at: https://web.archive.org/web/20170811235134/https://www.cse.cuhk.edu.hk/~pclee/www/pubs/lanman15.pdf, 6 pgs.

washington.edu, "Introduction to Parallel Programming and MapReduce," 2007, Washington.edu, available at: https://courses.cs.washington.edu/courses/cse490h/07wi/readings/IntroductionToParallelProgrammingAndMapReduce.pdf, 8 pgs.

Kang, "Parallel Data Processing with Hadoop/MapReduce," 2017, available at https://sites.cs.ucsb.edu/~tyang/class/240a17/slides/CS240TopicMapReduce.pdf, 48 pgs.

* cited by examiner

SERIAL STORAGE NODE PROCESSING OF DATA FUNCTIONS

TECHNICAL FIELD

The present disclosure generally relates to data storage, and in a more particular example, to processing data functions across storage nodes.

BACKGROUND

Often, distributed storage systems are used to store large amounts (e.g., terabytes, petabytes, exabytes, etc.) of data, such as objects or files in a distributed and fault tolerant manner with a predetermined level of redundancy.

Some existing object storage systems store data objects referenced by an object identifier versus file systems. This can generally allow object storage systems to surpass the maximum limits for storage capacity of file systems in a flexible way such that, for example, storage capacity can be added or removed as a function of the applications, systems, and/or enterprise needs, while reducing degradation in performance as the system grows. As a result, object storage systems are often selected for large-scale storage systems.

These large-scale storage systems may support the storage of data that is erasure coded and distributed across many storage devices. Data, such as files or objects, may be split into messages or similar data units which have an upper bound in size. These data units are then split up into a number of symbols. The symbols are then used as input for erasure coding. For example, when using a systematic erasure coding algorithm, the output of the erasure coding process yields the original symbols and a fixed number of additional parity symbols. The sum of these symbols are distributed among a selection of storage devices.

When a client system wants to perform an operation on the data stored in the system, all data may need to be reconstructed from the stored symbols and sent to the client system for processing. In many configurations, the aggregate bandwidth between storage system and client is many times smaller than the aggregate bandwidth of the storage nodes inside the storage system. Therefore, in such configurations, moving the data to the client is very inefficient, particularly if the output of the processing is small relative to the amount of data being processed, which is often the case.

For example, many systems may run operations called map-reduce operations on large volumes of data. A map-reduce operation may be composed of several functions. Each unit of data, such as an object or file, is first processed through a map-function to yield a single result for each unit. Then the results, sometimes referred to as intermediate contexts, are aggregated and combined (or reduced) using a reduce-function to provide a single result for the entire data set. In some configurations, when a client system wishes to execute operations, such as a map-reduce operation, on data stored in a distributed storage system, the data will first be fetched from the storage system, making the storage system reconstruct the original data, and then the client system will execute its map-reduce operation on the fetched data set.

As large-scale storage systems scale, transfer of large data sets for data operations may be inefficient. A need exists for at least storage systems that execute data functions, such as map-reduce functions, with reduced data transfers and improved efficiency and reliability.

SUMMARY

Various aspects for data function processing by storage systems, particularly, map-reduce and similar functions executed by the storage nodes are described.

One general aspect includes a system, including: a first storage node including a first storage medium and configured to: decode a first erasure encoded symbol from the first storage medium into a first symbol for a data unit, where the first symbol includes a first target subunit of the data unit; identify the first target subunit in the first symbol; and process the first target subunit using a serial-function to generate a first intermediate context, where the first intermediate context includes a first function result. A second storage node includes a second storage medium and is configured to: decode a second erasure encoded symbol from the second storage medium into a second symbol for the data unit, where the second symbol includes a second target subunit of the data unit; identify the second target subunit in the second symbol; process the second target subunit and the first intermediate context using the serial-function to generate a second function result; and return the second function result.

Implementations may include one or more of the following features. The serial-function may include: a map-function, where the map-function is configured to generate a temporary intermediate context for the second target subunit; and a reduce-function, where the reduce-function is configured to generate the second function result from the temporary intermediate context and the first intermediate context. The system may further include a plurality of storage nodes, where each of the plurality of storage nodes is configured to: generate at least one intermediate context from an erasure encoded symbol stored in that storage node using the serial-function; and send the at least one intermediate context to a next storage node from the plurality of storage nodes, where at least one intermediate context from the plurality of storage nodes is used by the first storage node to process the first target subunit. The plurality of storage nodes may store a plurality of erasure encoded symbols corresponding to a prior data unit and the at least one intermediate context from the plurality of storage nodes may be based on the prior data unit. The system may further include an incomplete subunit processor configured to: receive an incomplete subset of intermediate contexts from the plurality of storage nodes, where the incomplete subset of intermediate contexts includes incomplete subunits; aggregate at least one complete target subunit from the incomplete subunits; process the at least one complete target subunit using the serial-function and a prior intermediate context to generate at least one additional intermediate context; and send the at least one additional intermediate context to the next storage node including next symbol for the data unit. The first symbol further may include a first incomplete subunit, the first intermediate context may further include the first incomplete subunit, and the second storage node may be configured to identify the second target subunit in the second symbol from a combination of the second symbol and the first incomplete subunit. The first storage node may include a peer communication channel to the second storage node and the second storage node may be configured to receive the first intermediate context via the peer communication channel. The first symbol and the second symbol may be ordered symbols among a plurality of symbols corresponding to the data unit, where the plurality of symbols have a symbol order. The second storage node may be configured to receive the first intermediate context from the first storage node, the second symbol may be a terminal symbol in the symbol order, and the second function result may include a final result returned to a client system. The system may further include a client request handler configured to: receive the serial-function; identify a function data set including the data unit, where the first storage node and the second storage node are among a plurality of storage nodes configured to store the data unit in a plurality of erasure encoded symbols distributed among the plurality of storage nodes; and return a function result based on the second function result to a client system, where the client system is not among the plurality of storage nodes.

Another general aspect includes a computer-implemented method that includes: decoding, at a first storage node including a first storage medium, a first erasure encoded symbol from the first storage medium into a first symbol for a data unit, where the first symbol includes a first target subunit of the data unit; identifying, at the first storage node, the first target subunit in the first symbol; and processing, at the first storage node, the first target subunit using a serial-function to generate a first intermediate context, where the first intermediate context includes a first function result; decoding, at a second storage node including a second storage medium, a second erasure encoded symbol from the second storage medium into a second symbol for the data unit, where the second symbol includes a second target subunit of the data unit; identifying, at the second storage node, the second target subunit in the second symbol; processing, at the second storage node, the second target subunit and the first intermediate context using the serial-function to generate a second function result; and returning the second function result.

Implementations may include one or more of the following features. The computer-implemented method may further include generating, at a plurality of storage nodes and using the serial-function, a plurality of intermediate contexts from erasure encoded symbols stored in the plurality of storage nodes. Each storage node of the plurality of storage nodes may send at least one intermediate context from the plurality of intermediate contexts to a next storage node from the plurality of storage nodes. At least one intermediate context from the plurality of storage nodes may be used by the first storage node to process the first target subunit. The plurality of storage nodes may store a plurality of erasure encoded symbols corresponding to a prior data unit and the at least one intermediate context from the plurality of storage nodes is based on the prior data unit. The computer-implemented method may further including: identifying an incompletely recovered erasure encoded symbol from a failed storage node decode operation in the plurality of storage nodes; executing a recovery process for the incompletely recovered erasure encoded symbol to determine a recovered subunit of the data unit; processing the recovered subunit using the serial-function and a prior intermediate context to generate at least one additional intermediate context; and sending the at least one additional intermediate context to the next storage node including a next symbol for the data unit. The computer-implemented method may further include: receiving an incomplete subset of intermediate contexts from the plurality of storage nodes, where the incomplete subset of intermediate contexts includes incomplete subunits; aggregating at least one complete target subunit from the incomplete subunits; processing the at least one complete target subunits using the serial-function and a prior intermediate context to generate at least one additional intermediate context; and sending the at least one additional intermediate context to the next storage node including next symbol for the data unit. The first symbol may further include a first incomplete subunit, the first intermediate context may further include the first incomplete subunit, and the second storage node identifies the second target subunit in the second symbol from a combination of the second symbol and the first incomplete subunit. The first storage node may include a peer communication channel to the second storage node and the second storage node may receive the first intermediate context via the peer communication channel. The first symbol and the second symbol may be ordered symbols among a plurality of symbols corresponding to the data unit, where the plurality of symbols have a symbol order. The second storage node may receive the first intermediate context from the first storage node, the second symbol may be a terminal symbol in the symbol order, and the second function result may include a final result returned to a client system. The computer-implemented method may further include: receiving the serial-function; identifying a function data set including the data unit, where the first storage node and the second storage node are among a plurality of storage nodes configured to store the data unit in a plurality of erasure encoded symbols distributed among the plurality of storage nodes; and returning a function result based on the second function result to a client system, where the client system is not among the plurality of storage nodes.

Another general aspect includes a system that includes a first storage node including a first storage medium and a second storage node including a second storage medium. Means are provided for decoding, at the first storage node, a first erasure encoded symbol from the first storage medium into a first symbol for a data unit, where the first symbol includes a first target subunit of the data unit. Means for identifying, at the first storage node, the first target subunit in the first symbol. Means are provided for processing, at the first storage node, the first target subunit using a serial-function to generate a first intermediate context, where the first intermediate context includes a first function result. Means are provided for decoding, at the second storage node, a second erasure encoded symbol from the second storage medium into a second symbol for the data unit, where the second symbol includes a second target subunit of the data unit. Means are provided for identifying, at the second storage node, the second target subunit in the second symbol. Means are provided for processing, at the second storage node, the second target subunit and the first intermediate context using the serial-function to generate a second function result; and means are provided for returning the second function result.

Implementations may include one or more of the following features. The first symbol may further include a first incomplete subunit, the first intermediate context may further include the first incomplete subunit, and the means for identifying, at the second storage node, may identify the second target subunit in the second symbol from a combination of the second symbol and the first incomplete subunit.

The various embodiments advantageously apply the teachings of distributed storage networks and/or systems to improve the functionality of such computer systems. The various embodiments include operations to overcome or at least reduce the issues in the previous storage networks and/or systems discussed above and, accordingly, are more reliable and/or efficient than other computing networks. That is, the various embodiments disclosed herein include hardware and/or software with functionality to improve the efficient processing of data functions be executing those functions closer to the stored data. Accordingly, the embodiments disclosed herein provide various improvements to storage networks and/or storage systems.

It should be understood that language used in the present disclosure has been principally selected for readability and

DETAILED DESCRIPTION

Figure 1:
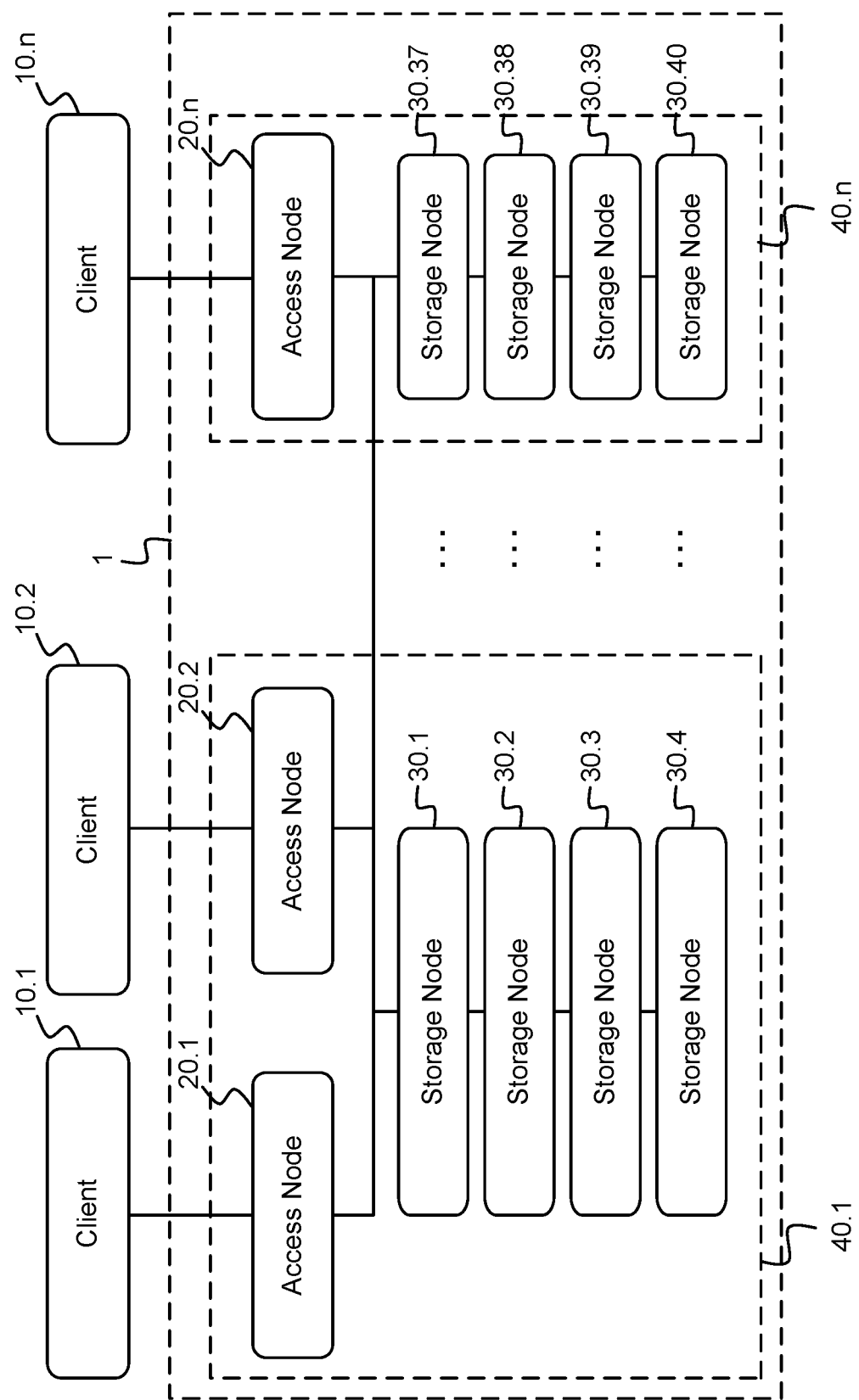
FIG. 1 schematically illustrates an example of a distributed storage system.

FIG. 1 shows an embodiment of an example distributed storage system 1. In some embodiments, the distributed storage system 1 may be implemented as a distributed object storage system which is coupled to one or more clients 10.1-10.n for accessing data objects through one or more controller or access nodes 20.1-10.n. The connection between the distributed storage system 1 and clients 10 could, for example, be implemented as a suitable data communication network. Clients 10 may host or interface with one or more applications that use data stored in distributed storage system 1. Such an application could, for example, be a dedicated software application running on a client computing device, such as a personal computer, a laptop, a wireless telephone, a personal digital assistant or any other type of communication device that is able to interface directly with the distributed storage system 1. However, according to alternative embodiments, the applications could, for example, comprise a suitable file system which enables a general purpose software application to interface with the distributed storage system 1, an application programming interface (API) library for the distributed storage system 1, etc. In some embodiments, access nodes 20 may include a file interface system for receiving file data requests from clients 10 according to a file system protocol and access data in storage nodes 30.1-30.40 using a different storage protocol, such as an object storage protocol.

As further shown in FIG. 1, the distributed storage system 1 comprises a plurality of controller or access nodes 20 and a plurality of storage nodes 30 which may be coupled in a suitable way for transferring data, for example by means of a conventional data communication network such as a local area network (LAN), a wide area network (WAN), a telephone network, such as the public switched telephone network (PSTN), an intranet, the internet, or any other suitable communication network or combination of communication networks. Access nodes 20, storage nodes 30 and the computing devices comprising clients 10 may connect to the data communication network by means of suitable wired, wireless, optical, etc. network connections or any suitable combination of such network connections. Although the embodiment of FIG. 1 shows only three access nodes 20 and forty storage nodes 30, according to alternative embodiments the distributed storage system 1 could comprise any other suitable number of storage nodes 30 and, for example, two, three or more access nodes 20 coupled to these storage nodes 30.

These access nodes 20 and storage nodes 30 may be built as general-purpose computers. Alternatively, they may be physically adapted for arrangement in large data centers, where they are arranged in modular racks 40.1-40.n comprising standard dimensions. Exemplary access nodes 20 and storage nodes 30 may be dimensioned to take up a single unit of such racks 40, which is generally referred to as 1U. Such an exemplary storage node may use a low-power processor and may be equipped with ten or twelve high capacity serial advanced technology attachment (SATA) disk drives and is connectable to the network over redundant Ethernet network interfaces. An exemplary access node 20 may comprise high-performance servers and provide network access to clients 10 over multiple high bandwidth Ethernet network interfaces. Data can be transferred between clients 10 and such access nodes 20 by means of a variety of network protocols including hypertext transfer protocol (HTTP)/representational state transfer (REST) object interfaces, language-specific interfaces such as Microsoft .Net, Python or C, etc. Additionally, such access nodes may comprise additional high bandwidth Ethernet ports to interface with the storage nodes 30. In some embodiments, HTTP/REST protocols complying with the Amazon Simple Storage Service (S3) object storage service may enable data transfer through a REST application protocol interfaces (API). Such access nodes 20 may operate as a highly available cluster of controller nodes with one or more integrated and/or independent interface systems, and provide for example shared access to the storage nodes 30, metadata caching, protection of metadata, etc.

As shown in FIG. 1 several storage nodes 30 can be grouped together, for example because they are housed in a single rack 40. For example, storage nodes 30.1-30.4 and 30.37-30.40 each are respectively grouped into racks 40.1 and 40.*n*. Access nodes 20 may be located in the same or different racks as the storage nodes to which the access nodes connect. A rack may have multiple access nodes, for example rack 40.1, a single access node as rack 40.*n*, or no access nodes (not shown) and rely on an access node in another rack or storage nodes or clients with built-in access node and/or controller node capabilities. These racks are not required to be located at the same location, they are often geographically dispersed across different data centers, such as for example rack 40.1-40.3 can be located at a data center in Europe, 40.4-40.7 at a data center in the USA and 40.8-40.10 at a data center in China.

Figure 2:
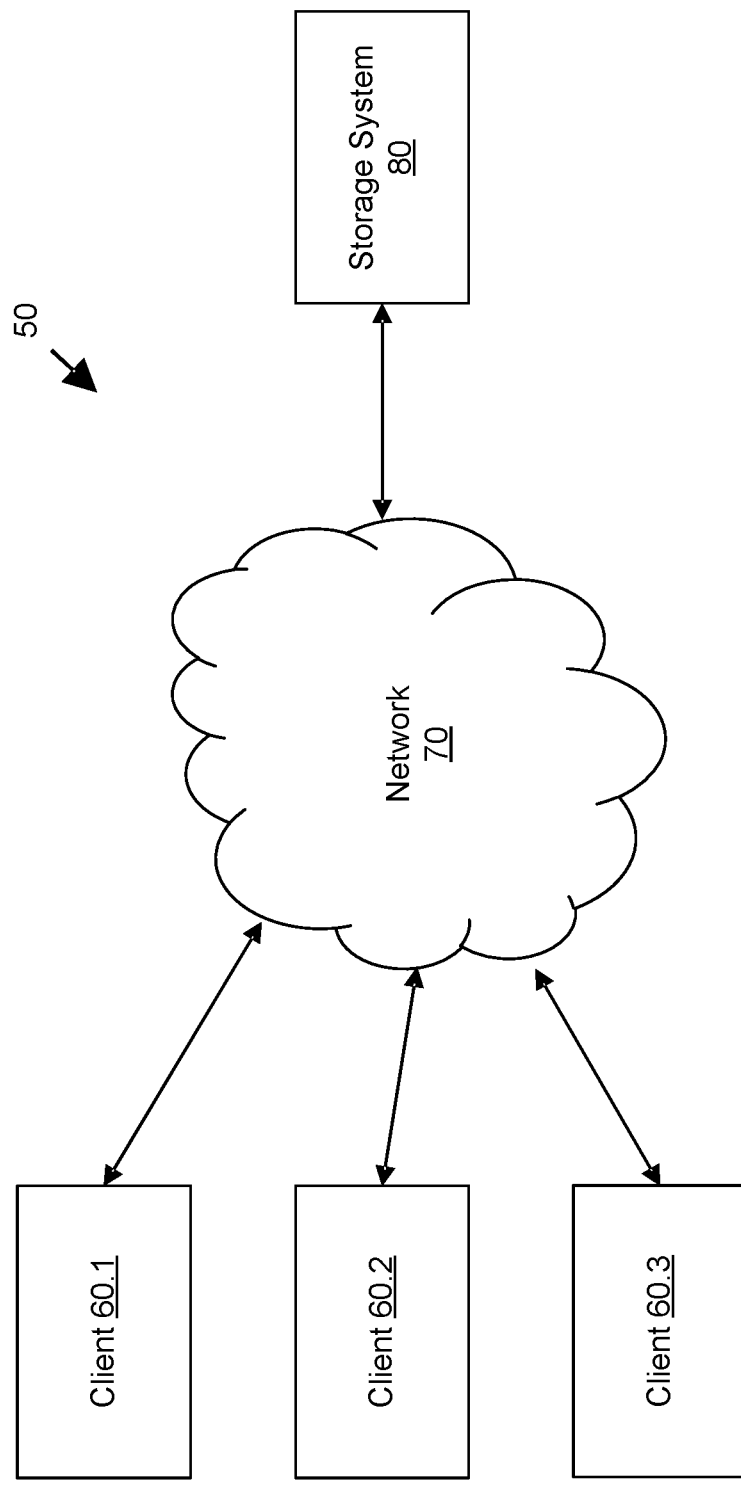
FIG. 2 schematically illustrates an example client architecture in which the distributed storage system of FIG. 1 may operate.

FIG. 2 is a block diagram of an example storage network 50 using a client architecture. In some embodiments, distributed storage system 1 may be embodied in such a storage network 50. As shown, storage network 50 can include multiple client devices 60 capable of being coupled to and in communication with a storage network 50 via a wired and/or wireless network 70 (e.g., public and/or private computer networks in any number and/or configuration (e.g., the Internet, an intranet, a cloud network, etc.)), among other examples that may include one client device 60.1 or two or more client devices 60 (e.g., is not limited to three client devices 60.1-60.3).

A client device 60 can be any computing hardware and/or software (e.g., a thick client, a thin client, or hybrid thereof) capable of accessing storage system 80 utilizing network 70. Each client device 60, as part of its respective operation, relies on sending input/output (I/O) requests to storage system 80 to write data, read data, and/or modify data. Specifically, each client device 60 can transmit I/O requests to read, write, store, communicate, propagate, and/or transport instructions, data, computer programs, software, code, routines, etc., to storage system 80. Client device(s) 60 and storage system 80 may comprise at least a portion of a client-server model. In general, storage system 80 can be accessed by client device(s) 60 and/or communication with storage system 80 can be initiated by client device(s) 60 through a network socket (not shown) utilizing one or more inter-process networking techniques. In some embodiments, client devices 60 may access one or more applications to use or manage a distributed storage system, such as distributed storage system 1 in FIG. 1.

Figure 3:
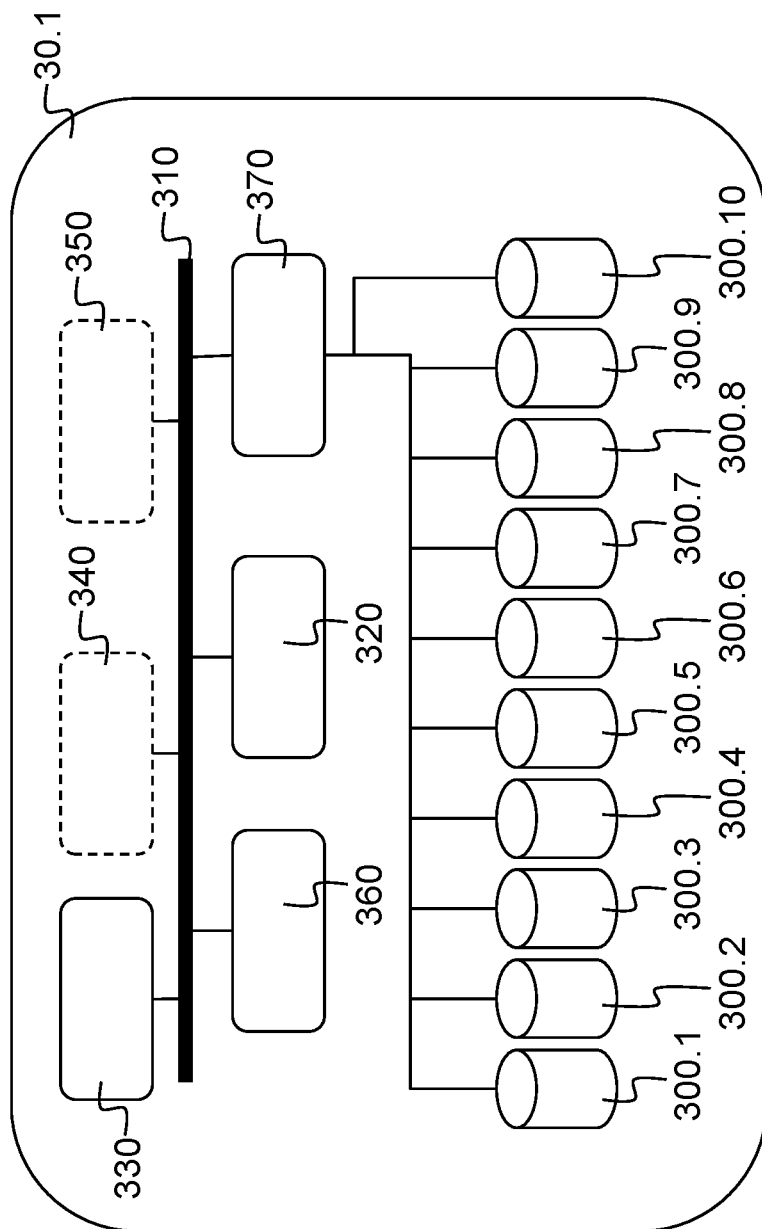
FIG. 3 schematically illustrates an example of a storage node of the distributed storage system of FIG. 1.

FIG. 3 shows a schematic representation of an embodiment of one of the storage nodes 30. Storage node 30.1 may comprise a bus 310, a processor 320, a local memory 330, one or more optional input units 340, one or more optional output units 350, a communication interface 360, a storage element interface 370, and two or more storage elements 300.1-300.10. Bus 310 may include one or more conductors that permit communication among the components of storage node 30.1. Processor 320 may include any type of conventional processor or microprocessor that interprets and executes instructions. Local memory 330 may include a random access memory (RAM) or another type of dynamic storage device that stores information and instructions for execution by processor 320 and/or a read only memory (ROM) or another type of static storage device that stores static information and instructions for use by processor 320. Input unit 340 may include one or more conventional mechanisms that permit an operator to input information to the storage node 30.1, such as a keyboard, a mouse, a pen, voice recognition and/or biometric mechanisms, etc. Output unit 350 may include one or more conventional mechanisms that output information to the operator, such as a display, a printer, a speaker, etc. Communication interface 360 may include any transceiver-like mechanism that enables storage node 30.1 to communicate with other devices and/or systems, for example mechanisms for communicating with other storage nodes 30 or access nodes 20 such as for example two gigabit (1 Gb) Ethernet interfaces.

Storage element interface 370 may comprise a storage interface such as for example a SATA interface or a small computer system interface (SCSI) for connecting bus 310 to one or more storage elements 300, such as one or more local disks, for example 3 terabyte (TB) SATA disk drives, and control the reading and writing of data to/from these storage elements 300. In one exemplary embodiment as shown in FIG. 2, such a storage node 30.1 could comprise ten or twelve 3 TB SATA disk drives as storage elements 300.1-300.10 and in this way storage node 30.1 would provide a storage capacity of 30 TB or 36 TB to the distributed storage system 1. According to the exemplary embodiment of FIG. 1 and in the event that storage nodes 30.2-30.40 are identical to storage node 30.1 and each comprise a storage capacity of 36 TB, the distributed storage system 1 would then have a total storage capacity of 1440 TB.

As is clear from FIGS. 1 and 3 the distributed storage system 1 comprises a plurality of storage elements 300. As will be described in further detail below, the storage elements 300, could also be referred to as redundant storage elements 300 as the data is stored on these storage elements 300 such that none or a specific portion of the individual storage elements 300 on its own is critical for the functioning of the distributed storage system. Each of the storage nodes 30 may comprise a share of these storage elements 300.

As shown in FIG. 1 storage node 30.1 comprises ten storage elements 300.1-300.10. Other storage nodes 30 could comprise a similar amount of storage elements 300, but this is, however, not essential. Storage node 30.2 could, for example, comprise six storage elements 300.11-300.16, and storage node 30.3 could, for example, comprise four storage elements 300.17-300.20. As will be explained in further detail below, the distributed storage system 1 may be operable as a distributed object storage system to store and retrieve a data object comprising data (e.g. 64 megabytes (MB) of binary data) and a data object identifier for addressing this data object, for example, a universally unique identifier such as a globally unique identifier (GUID). Embodiments of the distributed storage system 1 may operate as a distributed object storage system. Storing the data offered for storage by the application in the form of a data object, also referred to as object storage, may have specific advantages over other storage schemes such as block-based storage or file-based storage.

The storage elements 300 or a portion thereof may be redundant and operate independently of one another. This means that if one particular storage element 300 fails its function it can easily be taken on by another storage element 300 in the distributed storage system 1. However, as will be explained in more detail further below, the storage elements 300 are capable of providing redundancy without having to work in synchronism, as is for example the case in many well-known redundant array of independent disks (RAID) configurations, which sometimes even require disc spindle rotation to be synchronised. Furthermore, the independent and redundant operation of the storage elements 300 may allow a suitable mix of types of storage elements 300 to be used in a particular distributed storage system 1. It is possible to use for example storage elements 300 with differing storage capacity, storage elements 300 of differing manufacturers, using different hardware technology such as for example conventional hard disks and solid state storage elements, using different storage interfaces such as for example different revisions of SATA, parallel advanced technology attachment (PATA), and so on. This may result in advantages relating to scalability and flexibility of the distributed storage system 1 as it allows for adding or removing storage elements 300 without imposing specific requirements to their design in correlation to other storage elements 300 already in use in the distributed object storage system.

Figure 4:
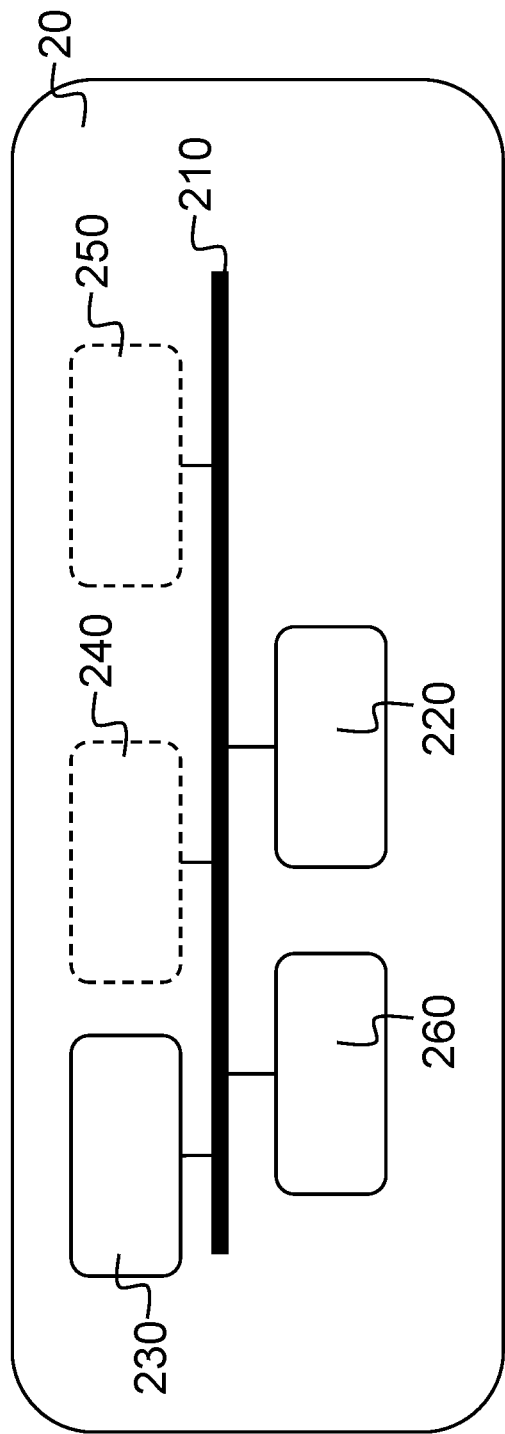
FIG. 4 schematically illustrates an example of a controller node or access node of the distributed storage system of FIG. 1.

FIG. 4 shows a schematic representation of an embodiment of the controller or access node 20. Access node 20 may include storage controller node functions and/or file system interface functions for client systems using file system protocols to access data stored in data objects in storage nodes 30. Access node 20 may comprise a bus 210, a processor 220, a local memory 230, one or more optional input units 240, one or more optional output units 250. In some embodiments, access node 20 may include object storage management functions, including object storage interface functions, version control management, and/or replication engines.

Bus 210 may include one or more conductors that permit communication among the components of access node 20. Processor 220 may include any type of conventional processor or microprocessor that interprets and executes instructions. Local memory 230 may include a random access memory (RAM) or another type of dynamic storage device that stores information and instructions for execution by processor 220 and/or a read only memory (ROM) or another type of static storage device that stores static information and instructions for use by processor 320 and/or any suitable storage element such as a hard disc or a solid state storage element. An optional input unit 240 may include one or more conventional mechanisms that permit an operator to input information to the access node 20 such as a keyboard, a mouse, a pen, voice recognition and/or biometric mechanisms, etc. Optional output unit 250 may include one or more conventional mechanisms that output information to the operator, such as a display, a printer, a speaker, etc. Communication interface 260 may include any transceiver-like mechanism that enables access node 20 to communicate with other devices and/or systems, for example mechanisms for communicating with other storage nodes 30 or access nodes 20 such as for example two 10 Gb Ethernet interfaces.

According to an alternative embodiment, the access node 20 could have an identical design as a storage node 30, or according to still a further alternative embodiment one of the storage nodes 30 of the distributed object storage system could perform both the function of an access node 20 and a storage node 30. According to still further embodiments, the components of the access node 20 as described in more detail below could be distributed amongst a plurality of access nodes 20 and/or storage nodes 30 in any suitable way. According to still a further embodiment, the clients 10 may run an access node 20. According to still further embodiments, access node 20 may be embodied in separate controller nodes and interface nodes with or without redundancy among the controller nodes and/or interface nodes.

Figure 5:
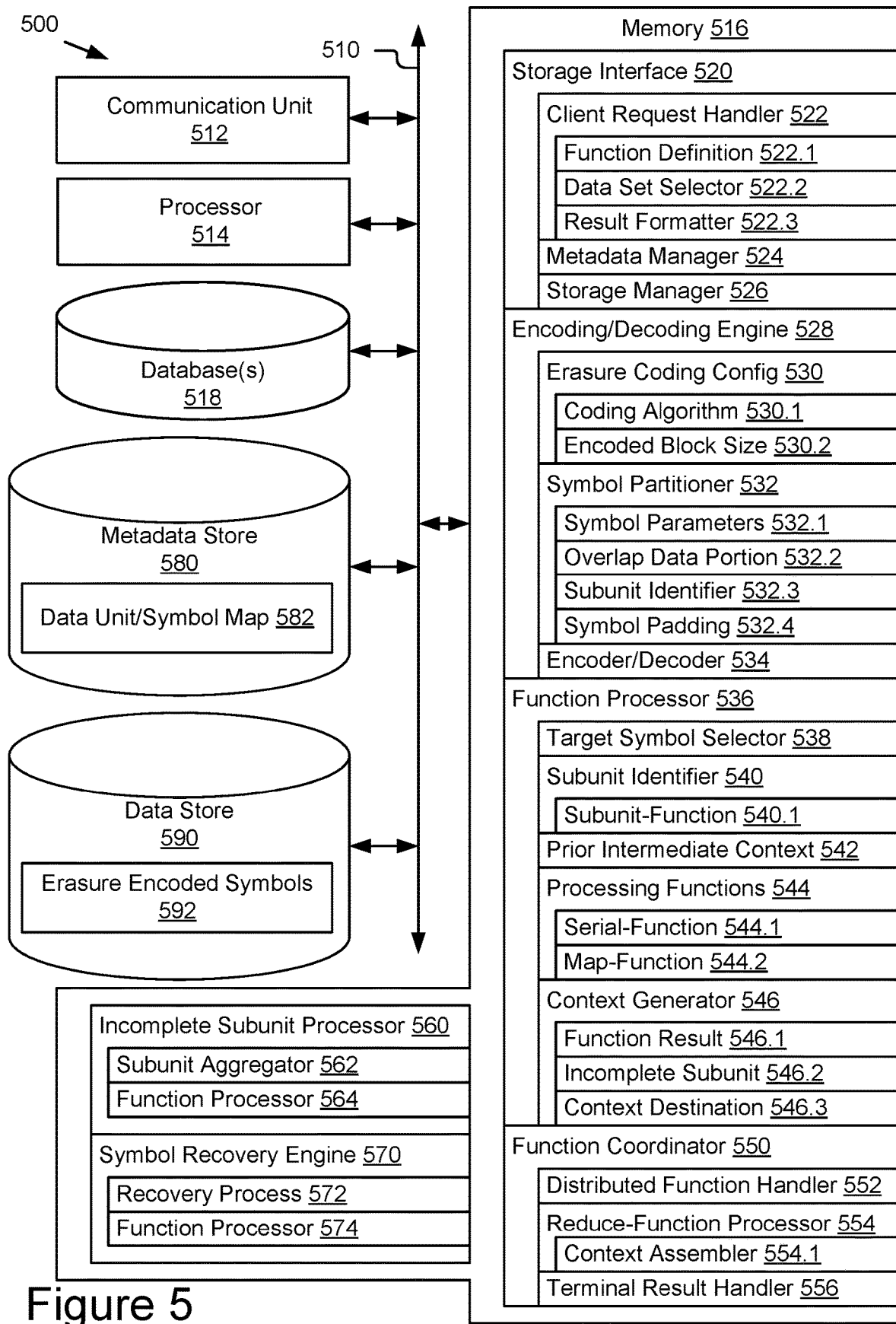
FIG. 5 schematically illustrates some example elements of a storage system for the distributed storage system of FIG. 1.

FIG. 5 schematically shows selected modules of a storage node, controller node, or combination thereof. Storage system 500 may be configured as a node with an architecture and/or hardware similar to controller nodes and/or storage nodes. Storage system 500 may incorporate elements and configurations similar to those shown in FIGS. 1-4. For example, storage system 500 may include a plurality of storage nodes 30 configured with the modules shown. In some embodiments, in addition to the modules hosted by storage nodes 30, one or more modules of storage system 500, such as storage interface 520, function coordinator 550, incomplete subunit processor 560, and/or symbol recovery engine 570 may be hosted by a controller or access node 20 configured as a storage controller.

Storage system 500 may include a bus 510 interconnecting at least one communication unit 512, at least one processor 514, and at least one memory 516. Bus 510 may include one or more conductors that permit communication among the components of access system 500. Communication unit 512 may include any transceiver-like mechanism that enables access system 500 to communicate with other devices and/or systems. For example, communication unit 512 may include wired or wireless mechanisms for communicating with file system clients, other access systems, and/or one or more object storage systems or components, such as storage nodes or controller nodes. Processor 514 may include any type of processor or microprocessor that interprets and executes instructions. Memory 516 may include a random access memory (RAM) or another type of dynamic storage device that stores information and instructions for execution by processor 514 and/or a read only memory (ROM) or another type of static storage device that stores static information and instructions for use by processor 514 and/or any suitable storage element such as a hard disc or a solid state storage element.

Storage system 500 may include or have access to one or more databases and/or specialized data stores, such metadata store 580 and data store 590. Databases may include one or more data structures for storing, retrieving, indexing, searching, filtering, etc. of structured and/or unstructured data elements. In some embodiments, metadata store 580 may be structured as reference data entries and/or data fields indexed by metadata key value entries related to data objects stores in data store 590. Data store 590 may include data objects comprised of object data (such as host data), some amount of metadata (stored as metadata tags), and a GUID. Metadata store 580, data store 590, and/or other databases or data structures may be maintained and managed in separate computing systems, such as storage nodes, controller nodes, or access nodes, with separate communication, processor, memory, and other computing resources and accessed by storage system 500 through data access protocols. Metadata store 580 and data store 590 may be shared across multiple storage systems 500.

Storage system 500 may include a plurality of modules or subsystems that are stored and/or instantiated in memory 516 for execution by processor 514. For example, memory 516 may include a storage interface 520 configured to receive, process, and respond to data requests and/or data operation or function commands from client systems or other nodes in distributed storage system 1. Memory 516 may include an encoding/decoding engine 528 for encoding and decoding symbols corresponding to data units (files, objects, messages, etc.) stored in data store 590. Memory 516 may include a function processor 536 for processing data operations or functions received from a client or host system, such as performing a map-reduce function on a data set stored in data store 590. Memory 516 may include a function coordinator 550 for coordinating data function or operation processing among a plurality of storage nodes. Memory 516 may include an incomplete subunit processor 560 for aggregating complete subunits from partial subunits stored across symbols in some embodiments. Memory 516 may include a symbol recovery engine 570 for recovering symbols that are the result of a failed decode operation by encoding/decoding engine 528. In some embodiments, encoding/decoding engine 528, function processor 536, function coordinator 550, incomplete subunit processor 560, and/or symbol recovery engine 570 may be integrated into storage interface 520 and/or managed as separate libraries or background processes (e.g. daemon) through an API or other interface.

Storage interface 520 may include an interface protocol or set of functions and parameters for storing, reading, and otherwise managing data requests to data store 590. For example, storage interface 520 may include functions for reading, writing, modifying, or otherwise manipulating data objects and/or files, as well as their respective client or host data and metadata in accordance with the protocols of an object or file storage system. In some embodiments, storage interface 520 may further enable execution of data operations for data store 590 and/or metadata store 580. For example, storage interface 520 may include protocols and/or interfaces for receiving data function requests that may include defining functions, target data sets, and/or result formatting and delivery, as well as executing those functions against data store 590.

In some embodiments, storage interface 520 may include a plurality of hardware and/or software modules configured to use processor 514 and memory 516 to handle or manage defined operations of storage interface 520. For example, storage interface 520 may include a client request handler 522, a metadata manager 524, and a storage manager 526. For any given client request, storage interface 520 may receive a client request through client request handler 522 and determine one or more operations based on the content of the request. These operations may include metadata operations handled by metadata manager 524 and/or object data operations handled by storage manager 526, including encoding and decoding operations. In some embodiments, data processing operations may be handled by storage interface 520 by calling one or more other modules, such as function processor 536 and/or function coordinator 550. The results of these operations may be processed, formatted, and returned by client request handler 522.

Client request handler 522 may include an interface and/or communication event-based condition for receiving data requests and/or operational commands from one or more clients. For example, client systems may send an object data request over a network connection and addressed to storage system 500 or a port or component thereof. Client request handler 522 may receive these requests and parse them according to the appropriate communication and storage protocols. For example, client request handler 522 may identify a transaction identifier, a client identifier, an object identifier (object name or GUID), a data operation, and additional parameters for the data operation, if any, from the received message or messages that make up the object data request. Similarly, operational commands may include syntax and parameters for accessing data stored according to a specific file system. Operational commands may also relate to the execution of data functions by storage system 500.

In some embodiments, client request handler 522 may be configured for managing data operations to be executed by storage system 500. For example, a client system may be able to define one or more data functions to be executed against a data set stored in data store 590 without transferring the data set to the client system. In some embodiments, data stored in erasure encoded symbols in data store 590 may be processed through at least one function (in a set of functions) by the storage node storing the symbol and an intermediate context may be returned for further processing, such as by another storage node using the same function or another function in the set.

Client request handler 522 may include one or more operations for managing data operation requests from a client system. For example, upon receiving a request or command that relates to a data operation, client request handler 522 may identify the management operation and/or parse the components of a complete data function operation. In some embodiments, a complete data operation request may include request parameters for a function definition, a target data set, and a result format. Client request handler 522 may include a function definition module 522.1, a data set selector 522.2, and/or a result formatter 522.3 for identifying, determining, or otherwise parsing the parameters of the data operation request.

In some embodiments, function definition module 522.1 may include an interface, function, or logic to receive and/or determine the set of functions to be used in a data function operation. For example, the set of functions may include a function or set of parameters that may be applied to a subunit identification function for identifying data subunits. Example subunit identification functions might include logic for identifying sentences within a block of text, a frame of data within a video image file, or a shape within a graphics file. In some embodiments, a subunit identification function may include a set of subunit parameters that define the portions of a data unit that should be treated as a subunit for the purposes of the set of functions. The set of functions may include a map-function, which may provide logic for operating on a subunit to determine an intermediate context for that subunit. For example, the map-function may count the nouns in a sentence, the faces in a frame of video, or the vertices in a shape and return a numeric value or type-value pair for each parameter of the subunit being determined by the map-function. A map-function may be a parallel-function that allows each subunit to be processed independently or a serial-function where each intermediate context provides one or more values for use in applying the serial-function to the next subunit. The set of functions may include a reduce-function, which provides logic for providing an aggregate or result value for the intermediate contexts determined for each subunit. The set of functions may also include terminal conditions, such as values or parameters to seed another function (e.g., a map or reduce function) or conditions signalling a final subunit and a result-function. In some embodiments, function definition module 522.1 may include an API or user interface for receiving selections of function types and parameters and may be sent from a client system.

In some embodiments, data set selector 522.2 may include an interface, function, or logic to receive and/or determine target data set to be processed using the set of functions for a particular data operation. For example, data set selector 522.2 may define the bounds of a set of data using any physical or logical grouping appropriate to the particular set of functions. Data set selector 522.2 may be configured for the type of data stored in data store 590 and/or the metadata from metadata store 580 that may be used to index the data. For example, data set selector 522.2 may be able to target a data object, set of data objects defined by some selection criteria, a bucket or other logical volume, or a similar set of parameters for defining data of interest. As another example, data set selector 522.2 may be able to target a data file, a set of data files defined by some selection criteria, an inode or other logical volume, or a similar set of parameters for defining data of interest. As still another example, data selector 522.2 may be able to target a physical storage location using a starting address and ending address, starting address and length, or similar boundary conditions that map to physical addresses or their contents. In some embodiments, data set selector 522.2 may define a total data set comprised of a plurality of data units, such as files, objects, or messages within the total data set. The plurality of data units may each be comprised of a plurality of subunits that may be the target of defined functions, such as map-functions. In some embodiments, data set selector 522.2 may include an API or user interface for receiving selections of data set parameters or identifiers that may be sent from a client system.

In some embodiments, result formatter 522.3 may include an interface, function, or logic to receive and/or determine the format of the results to be returned to a requesting system, such as a client or host system. For example, result formatter 522.3 may receive the result output from applying the set of functions to the target data set and format in accordance with the preferences of the requesting system, such as simplifying results to a fixed value, delta value, array of values, file, object, metadata table, etc. In some embodiments, a map-reduce function set may return a final reduce-result in a defined format. For example, the map-reduce function set may return a total number of words, sentences, and paragraphs in a large text file or text object for novel by formatting three numeric values preceded by appropriate tags in accordance with a defined syntax, such as comma separated values. A result may be returned for each of the plurality of data units and/or for the total data set. In some embodiments, result formatter 522.3 may include an API or user interface for returning result values to a client system.

Metadata manager 524 may include interfaces, functions, and/or parameters for creating, modifying, deleting, accessing, and/or otherwise managing object or file metadata, such as metadata stored in metadata store 580. For example, when a new object is written to data store 590, at least one new metadata entry may be created in metadata store 580 to represent parameters describing or related to the newly created object. Metadata manager 524 may generate and maintain metadata that enables metadata manager 524 to locate object or file metadata within metadata store 580. For example, metadata store 580 may be organized as a key-value store and object metadata may include key values for data objects and/or operations related to those objects that are indexed with a key value that include the object identifier or GUID for each object. In some embodiments, metadata manager 524 may also manage metadata stored in data store 590 with the data objects or files, such as metadata tags or headers. Metadata manager 524 may work in conjunction with storage manager 526 to create, modify, delete, access or otherwise manage metadata stored as tags or headers within data store 590.

Storage manager 526 may include interfaces, functions, and/or parameters for reading, writing, and deleting data elements in data store 590. For example, object PUT commands may be configured to write object identifiers, object data, and/or object tags to an object store. Object GET commands may be configured to read data from an object store. Object DELETE commands may be configured to delete data from object store, or at least mark a data object for deletion until a future garbage collection or similar operation actually deletes the data or reallocates the physical storage location to another purpose.

In some embodiments, storage manager 526 may oversee writing and reading data elements that are erasure encoded on the storage medium on which data store 590 is stored. When a message or data unit, such as a file or data object, is received for storage, storage manager 526 may pass the file or data object through an erasure encoding engine, such as encoding/decoding engine 528. The data unit may be divided into symbols and the symbols encoded into erasure encoded symbols 592 for storage in data store 590. In some embodiments, the symbols may be distributed among a plurality of storage nodes to assist with fault tolerance, efficiency, recovery, and other considerations.

When the data unit is to be accessed or read, storage manager 526 may identify the storage locations for each symbol, such as using a data unit/symbol map 582 stored in metadata store 580. Erasure encoded symbols 592 may be passed through an erasure decoding engine, such as encoding/decoding engine 528 to return the original symbols that made up the data unit to storage manager 526. The data unit can then be reassembled and used by storage manager 526 and other subsystems of storage interface 520 to complete the data access operation. Storage manager 526 may work in conjunction with metadata manager 524 for managing metadata, such as storage locations, versioning information, operation logs, etc. Storage manager 526 may work with encoding/decoding engine 528 for storing and retrieving erasure encoded symbols 592 in data store 590. Storage manager 526 may work in conjunction with function processor 536, function coordinator 550, incomplete subunit processor 560, and symbol recovery engine 570 to manage symbols and data units for the function processing.

In some embodiments, storage interface 520 may support metadata store 580 being distributed across multiple systems, such as a plurality of access systems. Metadata store 580 and/or portions thereof may be sharded data stores, wherein the data stores are partitioned into segments stored in different computing systems. Storage interface 520 may include the functions for locating and accessing relevant portions of the sharded data base.

Encoding/decoding engine 528 may include a set of functions and parameters for storing, reading, and otherwise managing encoded data, such as erasure encoded symbols 592, in data store 590. For example, encoding/decoding engine 528 may include functions for encoding a user data symbol into an erasure encoded data symbol and decoding an erasure encoded data symbol back into the original user data symbol. In some embodiments, encoding/decoding engine 528 may be included in the write path and/or read path for data store 590 that is managed by storage manager 526. In some embodiments, the encoding and decoding functions may be placed in separate encoding engines and decoding engines with redundant and/or shared functions where similar functions are used by both encoding and decoding operations.

In some embodiments, encoding/decoding engine 528 may include a plurality of hardware and/or software modules configured to use processor 514 and memory 516 to handle or manage defined operations of encoding/decoding engine 528. For example, encoding/decoding engine 528 may include an erasure coding configuration 530, a symbol partitioner 532, and encoders/decoders 534.

Erasure coding configuration 530 may include functions, parameters, and/or logic for determining the operations used to partition data units into symbols, encode, and decode those symbols. For example, various erasure coding algorithms exist for providing forward error correction based on transforming a message of a certain number of symbols into a longer message of more symbols such that the original message can be recovered from a subset of the encoded symbols. In some embodiments, a message may be split into a fixed number of symbols and these symbols are used as input for erasure coding. A systematic erasure coding algorithm may yield the original symbols and a fixed number of additional parity symbols. The sum of these symbols may then be stored to one or more storage locations.

In some embodiments, erasure coding configuration 530 may enable encoding/decoding engine 528 to be configured from available coding algorithms 530.1 and encoded block sizes 530.2 supported by storage system 500. For example, coding algorithms 530.1 may enable selection of an algorithm type, such as parity-based, low-density parity-check codes, Reed-Solomon codes, etc., and one or more algorithm parameters, such as number of original symbols, number of encoded symbols, code rate, reception efficiency, etc. Encoded block size 530.2 may enable selection of a block size for encoded symbols. For example, the encoded block size may be selected to align with storage media considerations, such as an erase block size for sold state drives (SSDs), and/or a symbol size that aligns with data unit and/or subunit parameters for data operations. In some embodiments, erasure coding configuration 530 may include an interface or API, such as a configuration utility, to enable a client system to select one or more parameters of coding algorithm 530.1 and/or encoded block size 530.2. For example, a user may configure coding algorithm 530.1 and encoded block size 530.2 to correspond to parameters of the target data set, such as aligning message size with functional data units and/or symbol size and number with subunits used in data function processing.

Symbol partitioner 532 may include functions, parameters, and/or logic for receiving a message for encoding and partitioning the message into a series of original symbols based on the data in the message. For example, a default symbol partitioning operation may receive a message and use a symbol size defined by erasure coding configuration 530 to partition the message into fixed number of symbols for encoding. In some embodiments, symbol partitioner 532 may include configurable symbol parameters 532.1 that may be selected to improve subsequent data function processing. For example, symbol parameters 532.1 may define a symbol size that aligns with subunit length in a data unit with fixed size subunits or a maximum subunit length. Symbol parameters 532.1 may include one or more parameters stored in a configuration table or other data structure for reference by symbol partitioner 532.

In some embodiments, symbol partitioner 532 may support the use of an overlap data portion 532.2 for shingling symbols such that each symbol includes a repeated portion of an adjacent symbol. For example, overlap data portion 532.2 may include an overlap data length parameter that indicates a portion of data equal to the length parameter that will be repeated in the next symbol and appends it to the end of current symbol. Repeated data portions in overlap data portion 532.2 may enable more efficient identification of subunits for data function processing at the storage node and reduce the frequency of incomplete subunits in some symbol configurations. In some embodiments, overlap data portion 532.2 may be determined by a user to align with one or more features of the target data set or data functions. For example, overlap data portion 532.2 may be set to a length parameter equal to a maximum subunit size or length to assure that no subunits are only available split across symbols (and would need to be aggregated from incomplete subunit portions in two symbols to be processed). In some embodiments, knowledge of predefined data formats, such as specific file or object types (e.g. Moving Pictures Expert Group (MPEG), comma separated values (CSV), graphics file types, etc.), may enable overlap data portion 532.2 to be set to a selected value that maximizes a probability that complete versions of all subunits will be available in at least one symbol and/or manages the trade-off between redundant subunits and exception handling for incomplete subunits. In some embodiments, symbol partitioner 532 may be configured to receive predetermined overlap length parameters from the client system for use in determining overlap data portion 532.2. Subunits that appear in multiple symbols may be skipped or otherwise handled during intermediate context forwarding and/or function coordination.

In some embodiments, symbol partitioner 532 may be configured to align symbols with subunits using a subunit identifier 532.3. For example, subunit identifier 532.3 may include logic for applying a subunit-function, such as subunit-function 540.1, to a data unit or message to determine the boundaries of each subunit. Subunit identifier 532.3 may be configured with subunit parameters corresponding to terminal markers or conditions for each subunit, such as a start indicator and an end indicator. In some data sets, subunit start indicators and end indicators may include flags, tags, codes, or other indicators to denote subunit boundaries and enable serial detection of subunits, while others may include a set of criteria applied to the data unit as a whole to determine the subunit boundaries. In some embodiments, subunit identifier 532.3 may return an identified subunit, list of subunits, subunit boundaries, subunit lengths, or other subunit parameters that enable subunits to be selected from the data unit for alignment with symbols. For example, in some embodiments, identified subunits may be assigned to each symbol by symbol partitioner 532 on a one-to-one basis such that complete subunits are available in each symbol.

In some embodiments, symbol partitioner 532 may be configured to use symbol padding 532.4 to assist in aligning subunits with symbols. For example, erasure coding configuration 530 may support a fixed encoded block size and/or encoded block sizes on defined increments, such as a multiple of a storage block, page, line, or other physical storage unit, in encoded block size 530.2. Symbol partitioner 532 may use symbol identifier 532.3 to identify a next subunit, determine the subunit length, and determine additional bits needed to meet encoded block size 530.2. Symbol padding 532.4 may fill in the difference with predetermined data values or data patterns, such as inserting null values into the remaining logical positions between the end of the subunit data and the end of the symbol.

Encoder/decoder 534 may include hardware and/or software encoders and decoders for implementing coding algorithm 530.1. For example, encoding/decoding engine 528 may include a plurality of register-based encoders and decoders for calculating parity for a symbol and returning erasure encoded symbols 592. In some embodiments, encoder/decoder 534 may be integrated in the write path and read path respectively such that data to be written to storage media and read from storage media pass through encoder/decoder 534 for encoding and decoding in accordance with coding algorithm 530.1.

Function processor 536 may include a set of functions and parameters for identifying target erasure encoded symbols, such as erasure encoded symbols 592, in data store 590, and processing them through one or more data functions, such as user data processing functions received through client request handler 522. For example, function processor 536 may be implemented in each storage node of storage system 500 to enable local processing of local erasure encoded symbols 592 in the same storage node as function processor 536 (using local memory 516, local processor 514, and local storage media for data store 590). In some embodiments, function processor 536 may operate in conjunction with the decoding functions of encoding/decoding engine 528 to retrieve and decode erasure encoded symbols 592 such that function processor 536 may operate on the original or decoded symbols.

User data processing functions may include data functions that operate on stored user data regardless of physical storage location, encoding, redundancy, encryption, and storage management functions used by the storage system to manage data storage. For example, user data processing functions may include data transformations, extractions, abstractions, feature identification, and other processes to support client application processing of data for applications like data analysis, artificial intelligence training, image processing, pattern recognition, etc.

In some embodiments, function processor 536 may include a plurality of hardware and/or software modules configured to use processor 514 and memory 516 to handle or manage defined operations of function processor 536. For example, function processor 536 may include a target symbol selector 538, a subunit identifier 540, a prior intermediate context handler 542, processing functions 544, and a context generator 546.

Target symbol selector 538 may include functions, parameters, and/or logic for selecting a target symbol for executing one or more functions against. For example, target symbol selector 538 may identify a target symbol among erasure encoded symbols 592 for retrieval and decoding through a local instantiation of encoding/decoding engine 528. Thus, a local encoding/decoding engine of a particular storage node may target local symbols stored in local storage media for data store 590. In some embodiments, function processor 536 may receive a function request message that indicates a target symbol and target symbol selector 538 may parse the symbol identification information from the function request message to determine the target symbol. For example, function coordinator 550 may send a function request to a target storage node storing the target symbol or another storage node may send the function request along with an intermediate context where the storage node has identified the next symbol and the storage node storing that symbol. Target symbol selector 538 may return a target symbol that has been decoded into the original symbol for further processing by function processor 536.

Subunit identifier 540 may include functions, parameters, and/or logic for identifying one or more subunits and/or subunit portions from a target symbol, such as the target symbol returned by target symbol selector 538. For example, subunit identifier 540 may include logic for applying a subunit-function, such as subunit-function 540.1, to a data unit or message to determine the boundaries of each subunit. Subunit identifier 540 may be configured with subunit parameters corresponding to terminal markers or conditions for each subunit, such as a start indicator and an end indicator. In some data sets, subunit start indicators and end indicators may include flags, tags, codes, or other indicators to denote subunit boundaries and enable serial detection of subunits, while others may include a set of criteria applied to the data unit as a whole to determine the subunit boundaries. Subunit-function 540.1 may include the logic, parameters, or conditions to be evaluated for identifying subunits from the symbol. For example, subunit function 540.1 may be provided as part of function definition 522.1 in client request handler 522 for the purpose of identifying subunit boundaries within data units. In some embodiments, subunit identifier 540 may return an identified subunit, list of subunits, subunit boundaries, subunit lengths, or other subunit parameters that enable subunits to be selected from the symbol for further processing by function processor 536. In some embodiments, subunit identifier 540 may return one or more complete subunits and one or more incomplete subunit portions where subunit boundaries did not align with symbol boundaries.

Prior intermediate context 542 may include functions, parameters, and/or logic for identifying one or more prior intermediate contexts to be used in processing data functions and/or generating the next intermediate context. For example, prior intermediate context 542 may identify a prior intermediate context that may be used as an input to processing functions 544. In some embodiments, function processor 536 may receive a function request message that includes an intermediate context and prior intermediate context 542 may parse the intermediate context from the function request message to determine the prior intermediate context for further processing by function processor 536. For example, function coordinator 550 may send an intermediate context to a target storage node storing the next target symbol or another storage node may send the intermediate context where the storage node has identified the next symbol and the storage node storing that symbol. The contents of intermediate contexts may be further discussed below with regard to context generator 546. Prior intermediate context 542 may return at least one intermediate context for use in further processing by function processor 536. In some embodiments, prior intermediate context 542 may receive a prior intermediate context when processing the first subunit of a data unit that may be based on a seed context used for new data units (which may be included in function definition 522.1 and/or received as part of a function processing request), a final result from a prior data unit, and/or a final intermediate context from a prior data unit.

Processing functions 544 may include functions, parameters, and/or logic for processing data subunits to generate an intermediate and/or final result. For example, processing functions 544 may include user selected and/or defined functions for processing application data to return desired results. In some embodiments, processing functions 536 may include subunit processing functions configured to process or transform the data contents of a target subunit into an intermediate result stored or communicated in an intermediate context. Processing functions 544 may return one or more result values for further processing by function processor 536.

For example, processing functions 544 may include one or more serial-functions 544.1 that receive prior intermediate context data (identified by prior intermediate context 542), apply serial-function 544.1 to the target symbol (sometimes using some or all of the prior intermediate context data), and generate a new intermediate context for forwarding to the next storage node containing the next symbol. Serial-function 544.1 may include a function that sequentially processes subunits to generate a serial-function result to be returned to the client system, with or without further processing of the final serial-function result. In some embodiments, the intermediate result of each subunit is dependent on the intermediate result of at least the immediately prior subunit and/or all prior subunits in a processing order for serial-function 544.2, such as the subunit order in the original data unit before partitioning into symbols.

As another example, processing functions 544 may include one or more map-functions 544.2 that process the target data subunit and return an intermediate context for aggregation or further processing. Mapping functions 544.2 may include functions that map a target subunit to an intermediate context used for further processing. In some embodiments, mapping functions 544.2 may include a function that processes the subunit regardless of order or is otherwise configured to enable parallel processing of subunits. In some embodiments, mapping functions 544.2 may receive and use a prior intermediate context (identified by prior intermediate context 542) to calculate the new intermediate context. Prior intermediate contexts for mapping functions 544.2 may not be dependent on processing order or an immediately prior subunit, such as using an intermediate context from a prior data unit or another seed value that is not the intermediate context of the immediately prior subunit.

Context generator 546 may include functions, parameters, and/or logic for generating an intermediate context from the results of processing functions 544. For example, results of processing functions 544 may be formatted and packaged with other context data for passing to a next storage node, function coordinator 550, or another module for continued processing. In some embodiments, context generator 546 may be configured to handle function result data 546.1 and incomplete subunit data 546.2 and format an intermediate context for delivery to an intermediate context destination 546.3. For example, function result data 546.1 may be the result data of processing functions 544. Incomplete subunit data 546.2 may include any incomplete subunit portions in a symbol that were not processed through processing functions 544, such as incomplete subunit portions identified by subunit identifier 540.

Intermediate context destination 546.3 may include logic for identifying the destination for the intermediate context. For example, a symbol processing request may specify the destination for the intermediate context, such as a next storage node or function coordinator 550. In some embodiments, intermediate context destination 546.3 may be identified by using a symbol identifier, data unit identifier, or other index and accessing data unit/symbol map 582 in metadata store 580 to determine a next symbol and/or next storage node storing the next symbol. In some embodiments, intermediate context destination 546.3 may include exception handling for conditions that suggest special handling, such as the presence of incomplete subunits, failed symbol recovery, and/or terminal conditions triggering final result or other special processing. For example, intermediate context destination 546.3 may determine the destination of an intermediate context including one or more incomplete subunit portions to be incomplete subunit processor 560, with or without prior intermediate context and/or function results 546.1. Intermediate context destination 546.3 may determine the destination of an intermediate context aligning with terminal conditions to function coordinator 550 or a terminal conditions handler (similar to terminal conditions handler 556) in function processor 536. Intermediate context destination 546.3 may determine a destination for the prior intermediate context to be symbol recovery engine 570 (or function coordinator 550) in response to encoding/decoding engine 528 failing to decode a symbol, such that the prior intermediate condition is available for further processing if and when the symbol is recovered.

Function coordinator 550 may include a set of functions and parameters for coordinating symbol processing among a plurality of storage devices, where each storage device includes at least one locally stored encoded symbol, such as erasure encoded symbols 592, in data store 590, and returning a result through client request handler 522. For example, function coordinator 550 may enable a storage controller and/or a storage node configured for the function coordinator role to receive a data function request through client request handler 522, determine one or more target data units in the target data set, identify the plurality of storage nodes storing symbols for the target date units, and initiate a distributed function processing operation across the plurality of storage nodes.

In some embodiments, function coordinator 550 may act as a central controller for distributed function processing, where function coordinator 550 sends function processing requests to each of the plurality of storage nodes with target symbols. For example, individual function processing requests for each symbol may be sent sequentially or in parallel and intermediate contexts from each request may be returned to function coordinator 550. In some embodiments, function coordinator 550 may be configured to manage terminal conditions and/or exceptions to function processing managed by distributed storage nodes. For example, function coordinator 550 may identify the plurality of storage nodes with target symbols and/or the storage node containing the first symbol to initiate a start terminal condition by sending a serial function processing request. Each storage node in the sequence of symbols may then process the subunits in their symbol, identify the next symbol and storage node, and pass a serial function processing request with an intermediate context to the next storage node.

In some embodiments, function coordinator 550 may include a plurality of hardware and/or software modules configured to use processor 514 and memory 516 to handle or manage defined operations of function coordinator 550. For example, function coordinator 550 may include a distributed function handler 552, a reduce-function processor 554, and a terminal result handler 556. In some embodiments, function coordinator 550 may include or have access to function processor 536, incomplete subunit processor 560, and/or symbol recovery engine 570.

Distributed function handler 552 may include functions, parameters, and/or logic for managing communication with function processors in the storage nodes. For example, distributed function handler 552 may use the target data unit to identify the storage nodes containing target symbols from data unit/symbol map 582. Based on storage node identifiers returned from the data unit/symbol map 582, request or command messages may be addressed to the relevant storage nodes. In some embodiments, distributed function handler 552 may include function processing work queue to organize function processing tasks to be completed for a target data set. For example, function definition 522.1 may determine whether symbols may be processed serially, in parallel, and/or in parallel batches. Distributed function handler 552 may include logic for formatting and addressing function processing requests to the storage nodes. For example, distributed function handler 552 may include a symbol identifier for the target symbol, a function identifier (or function definition), and a prior intermediate context or seed intermediate context, if applicable, in the function processing request. In some embodiments, the function processing request may include a context destination indicator, such as the storage node identifier for the next symbol in a symbol order. In some embodiments, the response to the function processing request, including the intermediate context, may be a return or response message to function coordinator 550.

In some embodiments, distributed function handler 552 may also determine seed contexts and/or intermediate contexts passed from one data unit to another data unit for a target data set including a plurality of data units. For example, a target data set may include a plurality of data units and each data unit may be handled according to the distributed function processing operations of function coordinator 550. One or more data units in the target data set may receive a seed context value that operates in the place of an intermediate context for the first symbol or symbols of a data unit. Similarly, the final intermediate context of one data unit may be passed as a seed context to a next data unit, where the plurality of data units have a data unit order in the data set and the processing functions from one data unit are contingent on the results of the prior data unit.

Reduce-function processor 554 may include functions, parameters, and/or logic for processing a plurality of intermediate contexts to generate a final result, such as a reduce-function result, for return to the client system. For example, reduce-function processor 554 may aggregate result values received in the intermediate contexts from all of the distributed function processing requests to the storage nodes. In some embodiments, reduce-function processor 554 may include a context assembler 554.1 that uses the intermediate contexts received by distributed function handler 552 to provide inputs to reduce-function processor 554. In some embodiments, context assembler 554.1 may extract processing function results from each intermediate context and organize them according to a symbol order and/or a processing order defined by function definition 522.1 for reduce-function processor 554. For example, the plurality of intermediate contexts may be arranged in the order of symbols and/or subunits or sorted according to another parameter or characteristic of the subunits or intermediate results.

In some embodiments, context assembler 554.1 may also identify unprocessed subunits based on incomplete subunit portions received in the intermediate contexts. For example, intermediate contexts from adjacent symbols may include incomplete subunit portions that could be combined to form a complete subunit and represent a gap in the subunit order and intermediate results for reduce-function processor 554. Function coordinator 550 may send incomplete subunit portions identified by context assembler 554.1 to incomplete subunit processor 560 for reassembly into completed subunits and/or resulting intermediate contexts. These additional intermediate contexts may be returned to function coordinator 550 and added by context assembler 554.1 to the other intermediate contexts to fill in any gaps in intermediate results. In some embodiments, context assembler 554.1 may also include logic for mapping the intermediate results to the series of subunits to remove any repeated results (such as redundant subunits in shingled symbols) and assure that intermediate results for each subunit have been received.

Reduce-function processor 554 may include one or more functions defined in function definition 522.1 for combining intermediate results. For example, intermediate results may include result values, such as counts, arrays of values, vectors, output tables or files, or other result data that is aggregated and processed in accordance with reduce-function 554. Reduce-function processor 554 reduces the intermediate contexts and the intermediate results they contain to aggregate reduce-result data. For example, the result data may be smaller than the aggregate intermediate contexts, which are in turn smaller than the subunits that were processed to generate them. Reduce-function processor 554 may return the reduce-result for further processing by function coordinator 550.

Terminal result handler 556 may include functions, parameters, and/or logic for receiving the reduce-result and/or an intermediate context from a terminal symbol for a data unit or data set and formatting and returning a final result for the data function processing. For example, the result data from reduce-function processor 554 may be formatted according to result formatter 522.3 and sent by client request handler 522 to the client system. In some embodiments, terminal result handler 556 may also identify terminal conditions for the distributed function processing, even if it does not include a reduce-function, and receive an intermediate context from a terminal symbol that may be formatted as a final result by terminal result handler 556 without additional function processing. In some embodiments, terminal result handler 556 may also identify error conditions for function processing, such as when context assembler 550.1 fails to identify intermediate results for all subunits in the target data set or symbol recovery engine 570 fails to recover a symbol that includes a subunit that cannot be reconstructed from other symbols. Terminal result handler 556 may provide an appropriate error message, with or without a partial result, to the client system.

Incomplete subunit processor 560 may include a set of functions and parameters for managing incomplete subunit portions that may result from subunits that are split across symbols in some encoding configurations. Incomplete subunit processor 560 may not be local to all subunit portions it operates on. For example, incomplete subunit processor 560 may be located in a storage controller to provide centralized aggregation of incomplete subunit portions to construct complete subunits. As described above, function processor 536 in each storage node may include incomplete subunit portions in the intermediate contexts passed among storage nodes or to function coordinator 550. In some embodiments, each storage node may include incomplete subunit processor 560 that may be called when an incomplete subunit portion is received in an intermediate context and may be combined with a local incomplete subunit portion to reconstruct a complete subunit.

Subunit aggregator 562 may include functions, parameters, and/or logic for aggregating incomplete subunit portions into complete subunits. For example, subunit aggregator 562 may include logic for identifying incomplete subunit order and subunit barrier conditions to reassemble two or more subunit portions into a complete subunit. In some embodiments, subunit aggregator 562 may receive incomplete subunit portions from adjacent symbols where one incomplete subunit portion was at the end of one symbol and the other incomplete subunit portion was at the beginning of the next adjacent symbol and the two incomplete subunit portions are aggregated to form the original and complete subunit for further processing.

In some embodiments, incomplete subunit processor 560 may include a function processor 564 similar to function processor 536. For example, once a complete subunit is aggregated by subunit aggregator 562, it may be processed by function processor 564 to generate an intermediate context as if the subunit had been identified within a single symbol and storage node. In some embodiments, incomplete subunit processor 560 may not include its own function processor 564 and may instead forward the complete subunit to function processor 536 in a storage node or function coordinator.

Symbol recovery engine 570 may include functions, parameters, and/or logic for recovering symbols after a failed decode operation by encoding/decoding engine 528. For example, storage nodes and/or storage controllers may include recovery process 572 for handling failed decode operations during decoding of erasure encoded symbols 592. In some embodiments, recovery process 572 may be triggered by a failed decode operation and may include a number of recovery operations, such as retries, using parity data to recover erase errors, and/or accessing redundant data stored in another location. If and when the missing symbol is recovered by recovery process 572, the symbol may be processed similar to other decoded symbols.

In some embodiments, symbol recovery engine 570 may include a function processor 574 similar to function processor 536. For example, once a symbol is recovered by recovery process 572, it may be processed by function processor 574 to generate an intermediate context as if the subunit had been identified within normally decoded symbol. In some embodiments, symbol recovery engine 570 may not include its own function processor 574 and may instead forward the recovered symbol to function processor 536 in a storage node or function coordinator.

Memory 516 may include additional logic and other resources (not shown) for processing data requests, such as modules for generating, queueing, and otherwise managing object or file data requests. Processing of a data request by storage interface 520 may include any number of intermediate steps that yield at least one data request to the distributed storage system.

Figure 6:
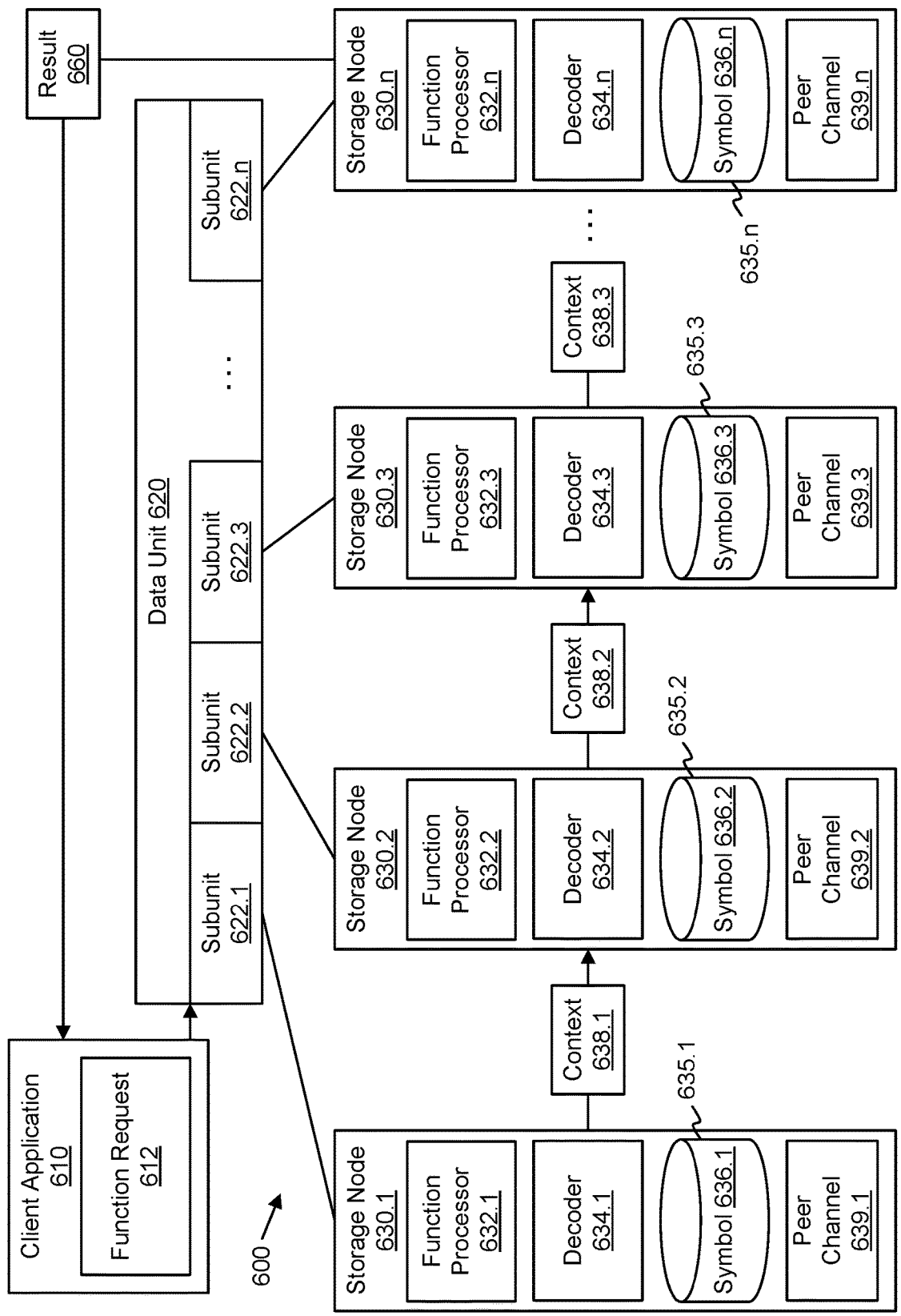
FIG. 6 schematically illustrates an example data unit being processed by a plurality of storage nodes.

FIG. 6 shows an example distributed storage system 600 that includes or interfaces with a client application 610 for storing and processing a data unit 620 through distributed data function processing across storage nodes 630.1-630.$n$. In some embodiments, storage nodes 630 may be configured similarly to storage system 500 in FIG. 5 for serial processing and a distributed or redundant function coordinator for handling the client function request. In an alternate embodiment, a storage controller (not shown) may receive function request 612 and act as function coordinator for initiating distributed function processing and/or returning the final result to client application 610.

Client application 610 may include one or more user applications configured to store and retrieve data elements from storage nodes 630. In some embodiments, client application 610 may be configured to read, write, and otherwise manage data elements, such as data unit 620, using a storage system interface API. Client application 610 may include a function request interface 612 that enables a user to configure a data function request for processing data elements stored in storage nodes 630. In some embodiments, function request interface 612 may enable the user to provide, select, or otherwise define a function set, a data set, and/or a result format for a data function processing request to be executed by storage nodes 630. For example, a client request handler, similar to client request handler 522 in FIG. 5, may receive and parse the data function processing request for initiating the distributed function processing across storage nodes 630.

In the example shown, data unit 620 is composed of subunits 622.1-622.$n$. For example, data unit 620 may include a message, data object, or data file, and subunits 622 may include data segments corresponding to internal data structures or patterns that form processing boundaries for distributed processing, such as map-functions.

Storage nodes 630 may be configured for distributed function processing of subunits 622 stored as symbols 636.1-636.$n$ in storage media 635.1-635.$n$ in each storage node 630. For example, storage nodes 630.1-630.$n$ may each include respective function processors 632.1-632.$n$, decoders 634.1-634.$n$, storage media 635.1-635.$n$, and peer communication channels 639.1-639.$n$. Symbols 636 may be stored as erasure encoded symbols in local storage media 635. Decoders 634 may be used by storage nodes 630 to decode the erasure encoded symbols and provide the original symbols to function processors 632 for function processing.

Function processors 632 may process the symbols using the set of functions provided in function request 612. For example, the set of functions may include a subunit function for identifying a subunit stored within the decoded symbols and a serial-function for processing the subunits to generate intermediate contexts 638.1-638.$n$. Storage nodes 630 may forward intermediate contexts 638 to the next storage node according to a symbol order from data unit 620. In some embodiments, storage nodes 630 may use peer communication channels 639 to send intermediate contexts 638 directly to the next storage node. For example, peer communication channels 639 may use remote direct memory access and/or direct message addressing through interconnect fabric between storage nodes 630.1 that bypass a control plane, such as a storage controller or host controller.

Intermediate contexts 638 may be passed from one storage node to a logically adjacent storage node (as determined by symbol order) to be used by function processors 632 to generate the next intermediate context. This process may continue for each symbol and subunit corresponding to data unit until a terminal subunit 622.$n$ and symbol 636.$n$ are reached. Storage node 630.$n$, containing the final or terminal symbol 636.$n$, may use function processor 632.$n$ to generate a final context or result 660 using the same function processing that generated the prior intermediate contexts. In some embodiments, recognition of the terminal condition for a serial function in storage node 630.$n$ may trigger the final intermediate context to be post-processed to generate result 660 and/or return result 660 to client application 610.

Figure 7:
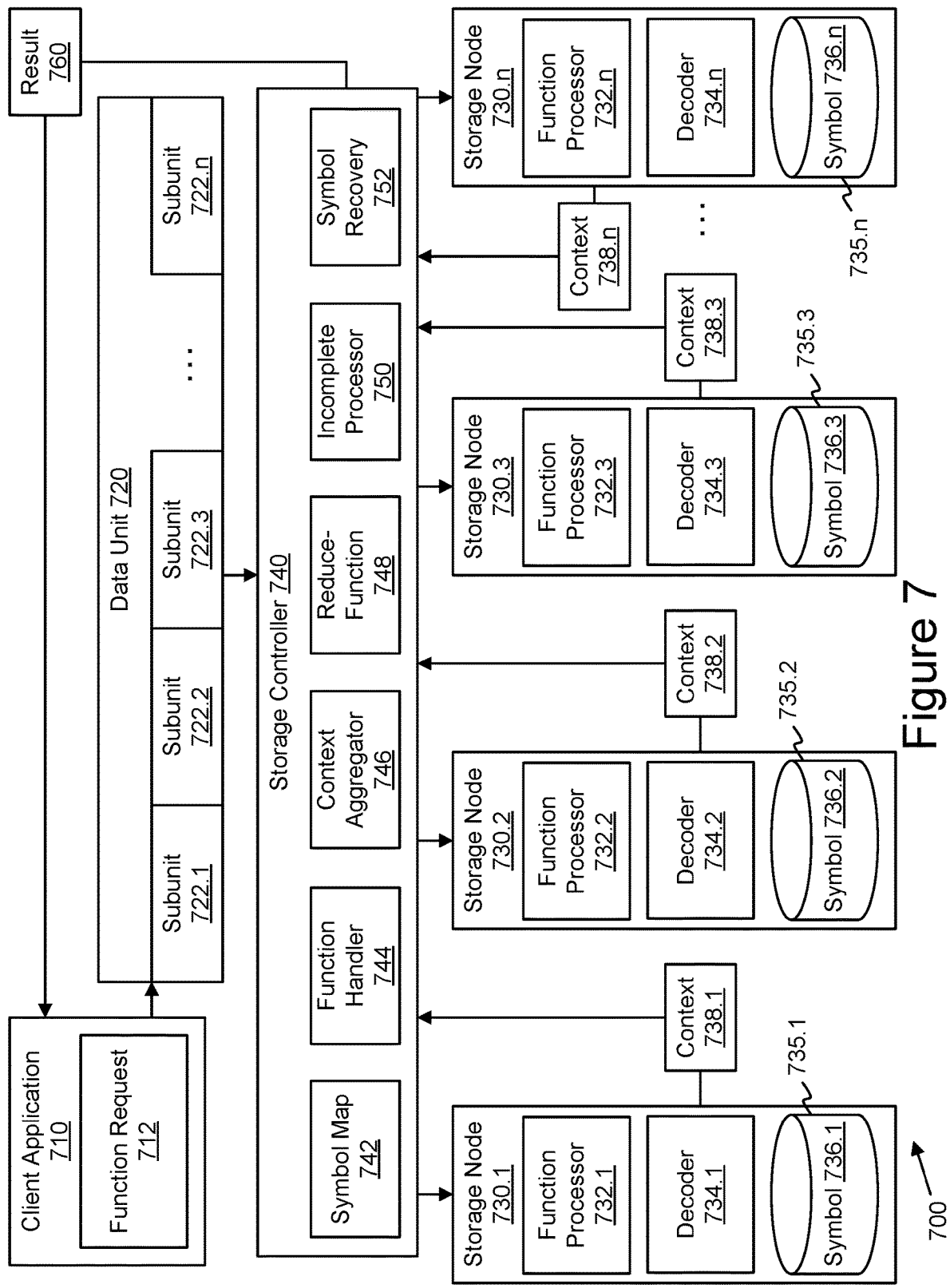
FIG. 7 schematically illustrates an example data unit being processed by a plurality of storage nodes with the assistance of a storage controller.

FIG. 7 shows another example distributed storage system 700 that includes or interfaces with a client application 710 for storing and processing a data unit 720 through distributed data function processing across storage nodes 730.1-730.$n$. In some embodiments, storage nodes 730 may be configured similarly to storage system 500 in FIG. 5 for parallel processing and a storage controller 740 for handling the client function request.

Client application 710 may include one or more user applications configured to store and retrieve data elements from storage nodes 730. In some embodiments, client application 710 may be configured to read, write, and otherwise manage data elements, such as data unit 720, using a storage system interface API. Client application 710 may include a function request interface 712 that enables a user to configure a data function request for processing data elements stored in storage nodes 730. In some embodiments, function request interface 712 may enable the user to provide, select, or otherwise define a function set, a data set, and/or a result format for a data function processing request to be executed by storage nodes 730. For example, a client request handler, similar to client request handler 522 in FIG. 5, may receive and parse the data function processing request at storage controller 740 for initiating the distributed function processing across storage nodes 730.

In the example shown, data unit 720 is composed of subunits 722.1-722.$n$. For example, data unit 720 may include a message, data object, or data file, and subunits 722 may include data segments corresponding to internal data structures or patterns that form processing boundaries for distributed processing, such as map-functions. Data unit 720 may have been provided to storage controller 740 for distributed storage across storage nodes 730 as erasure coded symbols 736.1-736.$n$.

In the example shown, storage controller 740 may instantiate a number of modules to assist with function coordination across storage nodes 730. For example, storage controller 740 may include: a symbol map similar to data unit/symbol map 582 in FIG. 5; a function handler 744 similar to distributed function handler 552 in FIG. 5; a context aggregator 746 similar to context assembler 554.1 in FIG. 5; a reduce-function 748 similar to reduce-function processor 554 in FIG. 5; an incomplete subunit processor 750 similar to incomplete subunit processor 560 in FIG. 5; and a symbol recovery engine 752 similar to symbol recovery engine 570 in FIG. 5.

Storage nodes 730 may be configured for distributed function processing of subunits 722 stored as symbols 736.1-736.$n$ in storage media 735.1-735.$n$ in each storage node 730. For example, storage nodes 730.1-730.$n$ may each include respective function processors 732.1-732.$n$, decoders 734.1-734.$n$, and storage media 735.1-735.$n$. Symbols 736 may be stored as erasure encoded symbols in local storage media 735. Decoders 734 may be used by storage nodes 730 to decode the erasure encoded symbols and provide the original symbols to function processors 732 for function processing.

Function processors 732 may process the symbols using the set of functions provided in function request 712. For example, the set of functions may include a subunit function for identifying a subunit stored within the decoded symbols and a map-function for processing the subunits to generate intermediate contexts 738.1-738.$n$. Storage nodes 730 may return intermediate contexts 738 to storage controller 740 for aggregation and further processing. In some embodiments, storage controller 740 may send a prior intermediate context to the next storage node in a processing order for use by function processors 732 in generating the next intermediate context.

Intermediate contexts 738 may be returned to storage controller 740 for aggregation by context aggregator 746 and application of reduce-function 748. Once the intermediate contexts 738 for all symbols 736 are returned to storage controller 740, storage controller 740 may aggregate and process the intermediate contexts through the reduce-function to generate result 760. Storage controller 740 may return result 760 to client application 710 in response to function request 712. In some embodiments, storage controller 740 may include incomplete subunit processor 750 and symbol recovery engine 752 for handling exceptions that may occur in decoding and/or function processing by storage nodes 730.

FIGS. 8-11 show different encoding configurations for parsing data units into subunits and partitioning date units into symbols, with varying degrees of alignment between subunits and symbols. These different configurations may be enabled by an encoding/decoding engine, such as encoding/decoding engine 528 in FIG. 5.

Figure 8:
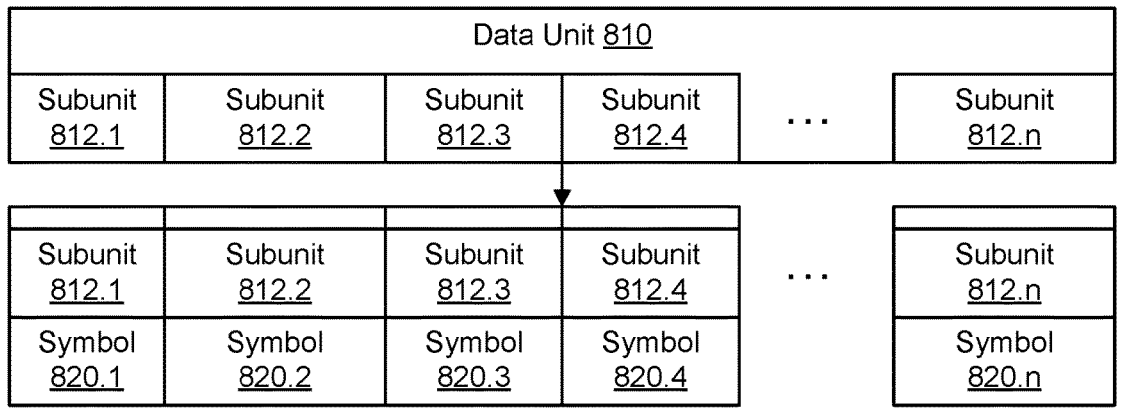
FIG. 8 schematically illustrates an example configuration for encoding a data unit across symbols.

As shown in FIG. 8, data unit 810 may be parsed into subunits 812.1-812.$n$, such as based on a subunit function for a set of data processing functions, to align with an encoding configuration 800. Subunits 812 may have varying subunit lengths or sizes determined by data boundaries or structures identified by a subunit function. In encoding configuration 800, symbols 820.1-820.$n$ are assigned similarly varying sizes or lengths based on a varying encoded block length. As a result, there is a one-to-one relationship between aligned subunits 812 and symbols 820. All subunits 812 are complete data subunits. Note that in some embodiments, subunits 812 may be defined to be a standard length or size, allowing subunits 812 and symbols 820 to both align and meet a predetermined encoded block size.

Figure 9:
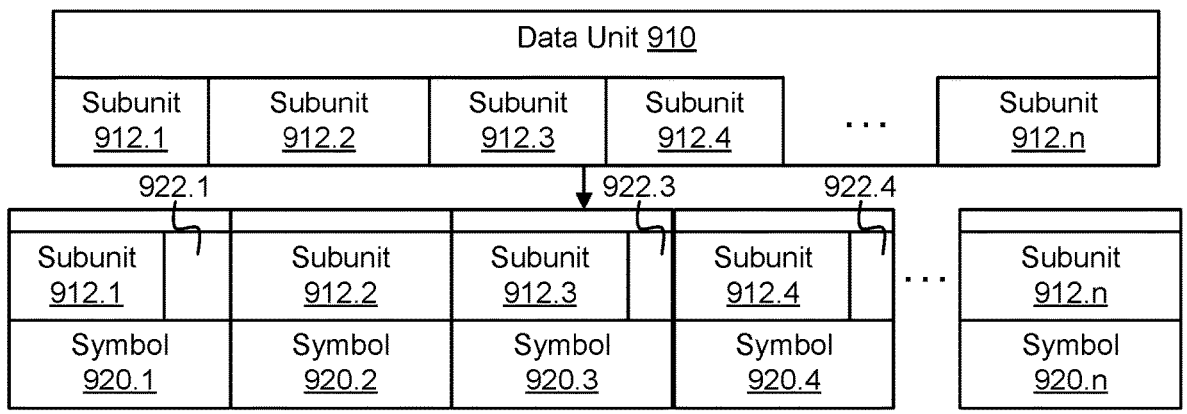
FIG. 9 schematically illustrates another example configuration for encoding a data unit across symbols.

As shown in FIG. 9, data unit 910 may be parsed into subunits 912.1-912.$n$, such as based on a subunit function for a set of data processing functions, to align with an encoding configuration 900. Subunits 912 may have varying subunit lengths or sizes determined by data boundaries or structures identified by a subunit function. In encoding configuration 900, symbols 920.1-920.$n$ are assigned a predetermined encoded block length that is at least as large as the largest subunits 912. As a result, there is a one-to-one relationship between aligned subunits 912 and symbols 920. Because not all subunits 912 are as long or large as their corresponding symbols, such as subunits 912.1, 912.3, 912.4, additional data may be provided to fill the difference between the subunit length and the symbol length and meet the predetermined encoded block size. For example, null values or another filler data pattern may be used to fill the unused portions 922.1, 922.3, 922.4 of symbols 920.1, 920.3, 920.4. In an alternate embodiment, unused portions 922.1, 922.3, 922.4 may include the adjacent portion of the next subunit, rather than null values.

Figure 10:
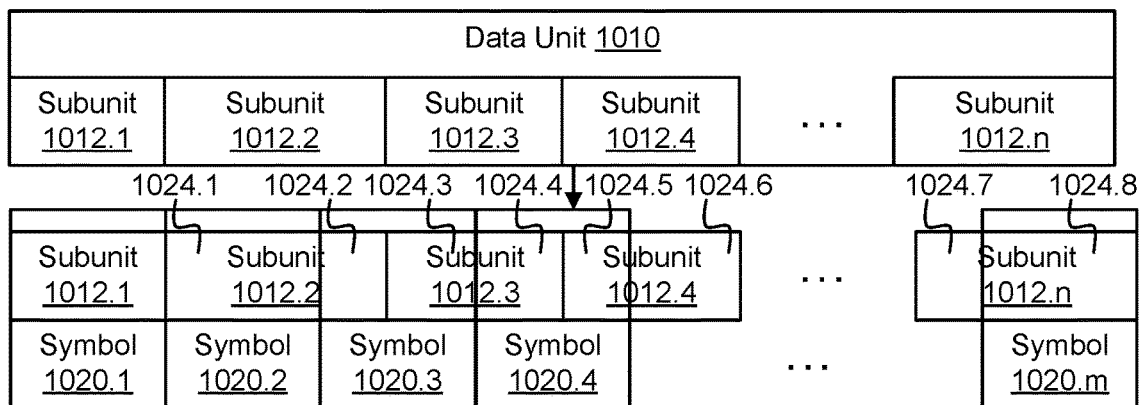
FIG. 10 schematically illustrates another example configuration for encoding a data unit across symbols.

As shown in FIG. 10, data unit 1010 may be parsed into subunits 1012.1-1012.$n$, such as based on a subunit function for a set of data processing functions, to align with an encoding configuration 1000. Subunits 1012 may have varying subunit lengths or sizes determined by data boundaries or structures identified by a subunit function. In encoding configuration 1000, symbols 1020.1-1020.$m$ are assigned a predetermined encoded block length that may not be aligned with subunit lengths. In the example shown, some subunits may align with symbols 1020, but most are larger than the symbol size and span or are distributed across more than one symbol. Note that a similar configuration is also possible where the symbol length may be substantially larger than some subunits and a symbol may include multiple complete subunits, as well as one or two partial subunits at the ends. In a data unit with substantial variance in subunit sizes, it is possible to have some subunits that are smaller than the symbol size, creating the possibility of multiple complete subunits in one symbol, and some subunits that are larger than the symbol size, creating the possibility of symbols with only partial subunits. In the example shown, symbol 1020.1 include a complete subunit 1012.1; symbol 1020.2 includes an incomplete subunit portion 1024.1, that is a first portion of subunit 1012.2; symbol 1020.3 includes two incomplete subunit portions 1024.2 (second portion of subunit 1012.2) and 1024.3 (first portion of subunit 1012.3); symbol 1020.4 includes two incomplete subunit portions 1024.4 (second portion of subunit 1012.3) and 1024.5 (first portion of subunit 1012.4—the second portion of subunit 1012.4 would be in the next symbol, which is not shown); and symbol 1020.$m$ includes an incomplete subunit portion 1024.8 (second portion of 1012.$n$—the first portion of subunit 1012.$n$ would be in the preceding symbol, which is not shown). Note that in the example shown, the number of symbols m would be greater than the number of subunits n. In a configuration where the symbol size is larger than the average subunit size, the number of symbols m would be less than or equal to the number of subunits n.

Figure 11:
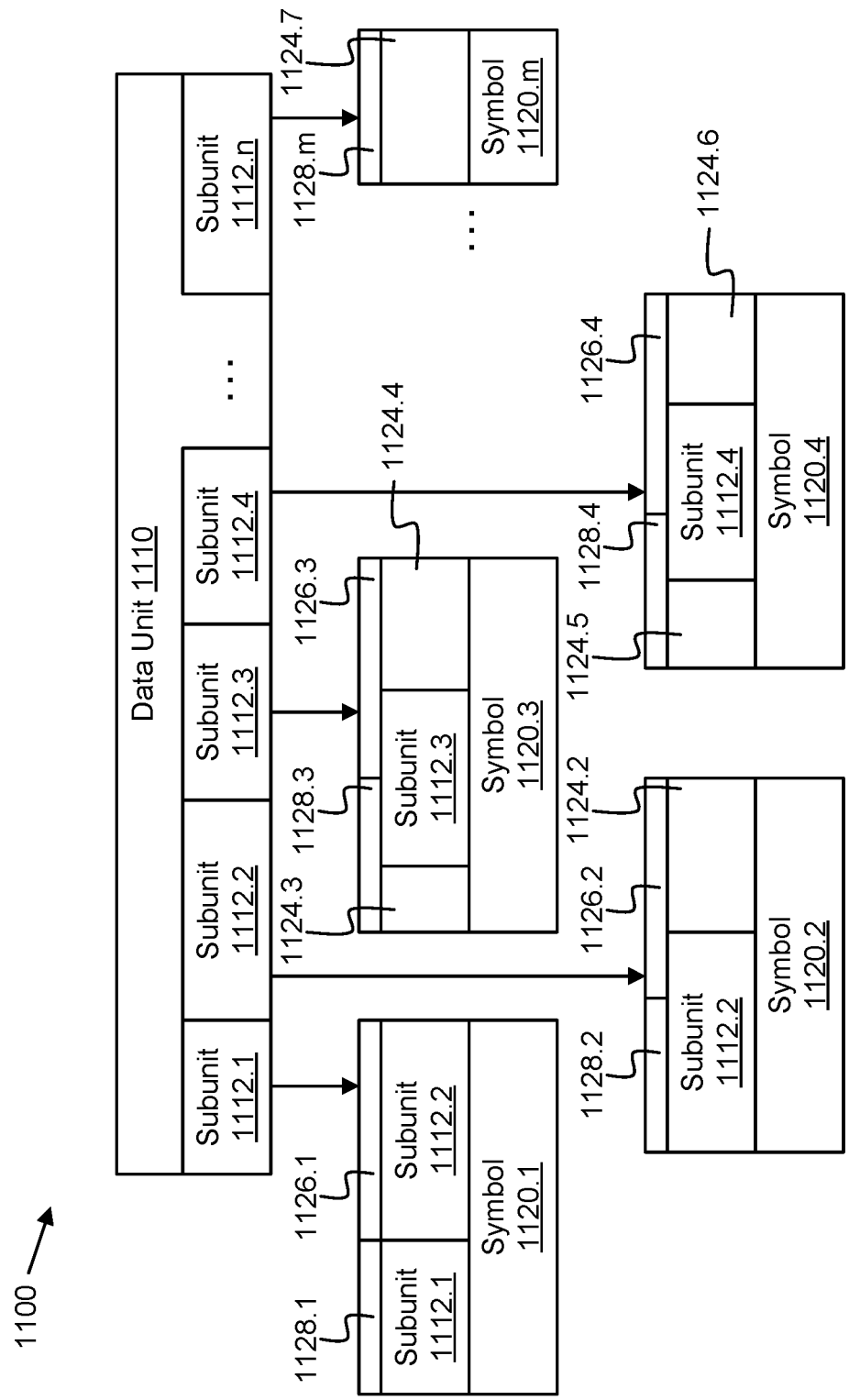
FIG. 11 schematically illustrates another example configuration for encoding a data unit across symbols.

As shown in FIG. 11, data unit 1110 may be parsed into subunits 1112.1-1112.$n$, such as based on a subunit function for a set of data processing functions, to align with an encoding configuration 1100 employing data shingling. Subunits 1112 may have varying subunit lengths or sizes determined by data boundaries or structures identified by a subunit function. In encoding configuration 1100, symbols 1120.1-1120.$m$ may be assigned a predetermined symbol length 1128.1-1128.$m$ that may not be aligned with subunit lengths. In addition, symbols 1120 include an additional overlap data portion 1126.1-1126.4 (though overlap data portions up to 1126.$m$-1 would exist but are not shown) having an overlap data portion length or size. In the example shown, the overlap length has been configured or selected to equal the largest subunit length or size to assure that each symbol includes at least one complete subunit and every subunit exists in at least one complete version in single symbol. Note that a similar configuration is also possible where the overlap length is smaller than the largest subunit length and may combine with the base symbol size to decrease the likelihood of any subunit being available only split across symbols, while not assuring that split subunits never occur. For example, these rare split subunits may be handled by an incomplete subunit processor, while most subunits would be decoded from a single symbol in a single storage node.

In the example shown, symbol 1120.1 includes complete subunit 1112.1 and complete subunit 1112.2. Symbol 1120.2 starts from a partition based on predetermined symbol length 1128.1 of symbol 1120.1 and includes complete subunit 1112.2 (a second complete copy) and an incomplete subunit portion 1124.2, that is a first portion of subunit 1112.3. Symbol 1120.3 starts from a partition based on predetermined symbol length 1128.2 of symbol 1120.2 and includes two incomplete subunit portions 1124.3 (second portion of subunit 1112.2) and 1124.4 (first portion of subunit 1112.4) and complete subunit 1112.3. Symbol 1120.4 starts from a partition based on predetermined symbol length 1128.3 of symbol 1120.3 and includes two incomplete subunit portions 1124.5 (second portion of subunit 1112.3) and 1124.6 (first portion of a next subunit, which is not shown). Symbol 1120.$m$ starts from the partition of the prior symbol and includes an incomplete subunit portion 1124.7 (second portion of 1012.$n$—the first portion of subunit 1112.$n$ would be in the preceding symbol, which is not shown). Note that in the example shown, symbol 1120.$m$ may be unnecessary, because the complete version subunit 1112.$n$ would be in the prior symbol. In other configurations, the final symbol may include an overlap data portion and/or the final symbol may include a complete or partial subunit that may be needed for reconstructing all subunits from the symbols.

Figure 12:
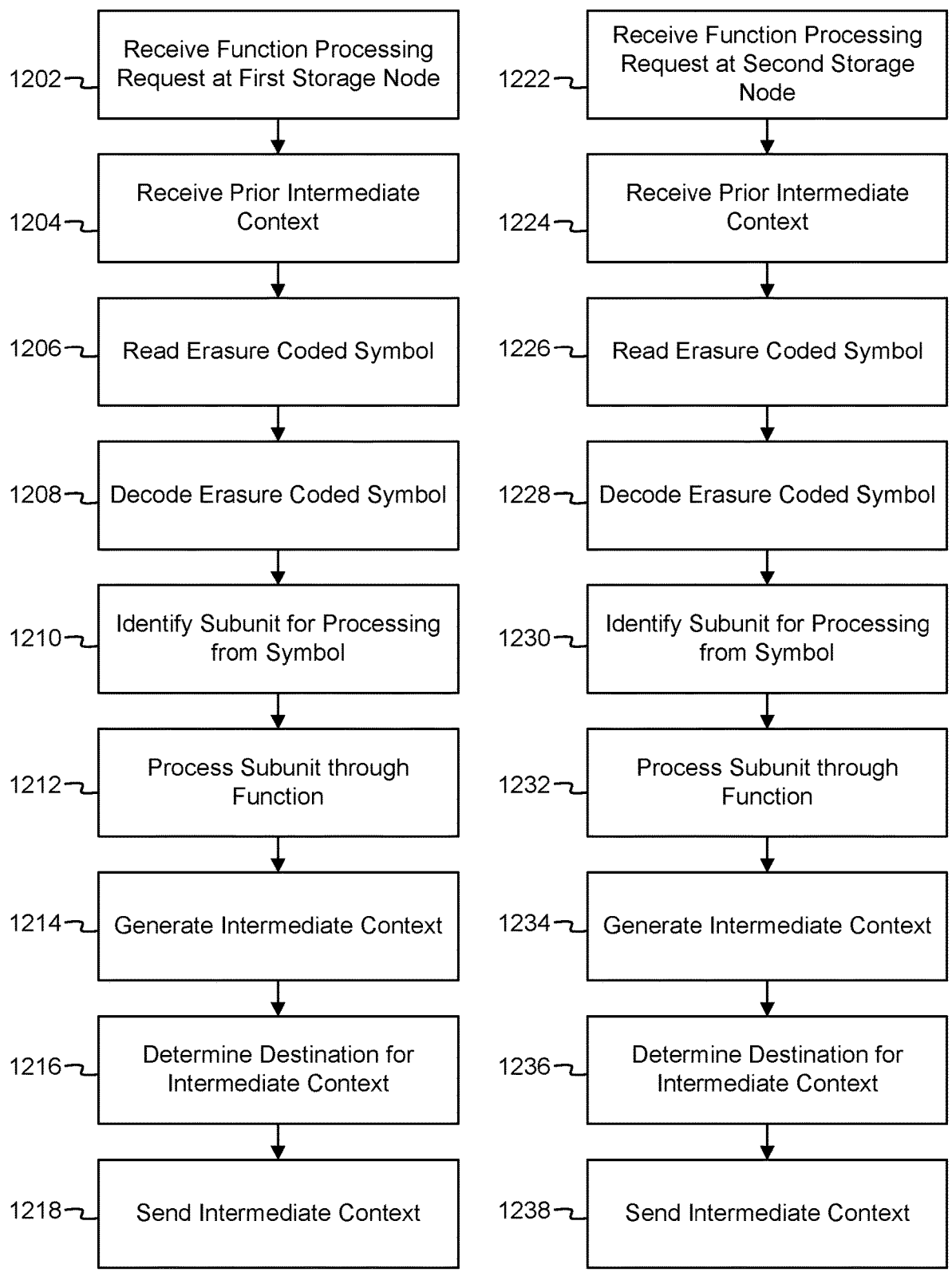
FIG. 12 illustrates an example method of function processing across storage nodes.

As shown in FIG. 12, the storage system 500 may be operated according to an example method of distributed processing of data functions across multiple storage nodes, i.e. according to the method 1200 illustrated by the blocks 1202-1238 of FIG. 12. In some embodiments, blocks 1222-1238 may be executed in parallel with blocks 1202-1218. In some embodiments, blocks 1222-1238 may be executed in series with blocks 1202-1218, where block 1222 may be initiated following completion of block 1218.

At block 1202, a function processing request may be received at a first storage node. For example, function processing may be initiated by a client system directly or through a storage controller or other function coordinator. At block 1222, a corresponding function processing request may be received at a second storage node.

At block 1204, a prior intermediate context may be received. For example, an intermediate context from processing a prior symbol and/or prior data unit may be received by the first storage node. At block 1224, a similar operation may occur at the second storage node.

At block 1206, an erasure coded symbol may be retrieved. For example, an erasure coded symbol corresponding to a target subunit for a data unit may be read from a local storage medium by the first storage node. At block 1226, a similar operation may occur at the second storage node.

At block 1208, the erasure coded symbol may be decoded. For example, a decode engine in the first storage node may decode the erasure coded symbol to recover the original symbol. At block 1228, a similar operation may occur at the second storage node.

At block 1210, a subunit for processing may be identified from the decoded symbol. For example, a subunit function may be applied to identify a target subunit within the symbol data at the first storage node. At block 1230, a similar operation may occur at the second storage node.

At block 1212, the subunit may be processed through a distributed function. For example, the prior intermediate context and the identified subunit may be processed through a map or serial function by the first storage node. At block 1232, a similar operation may occur at the second storage node.

At block 1214, an intermediate context may be generated based on the output of the distributed function. For example, the function result of the distributed function may be included in an intermediate context by the first storage node. At block 1234, a similar operation may occur at the second storage node.

At block 1216, a destination for the intermediate context may be determined. For example, the storage controller initiating the function processing request, a next storage node for a serial processing of symbols, or a client system may be determined as a destination by the first storage node. At block 1234, a similar operation may occur at the second storage node.

At block 1218, the intermediate context may be sent to the destination. For example, the first storage node may send the intermediate context to the destination determined at block 1216. At block 1238, a similar operation may occur at the second storage node.

Figure 13:
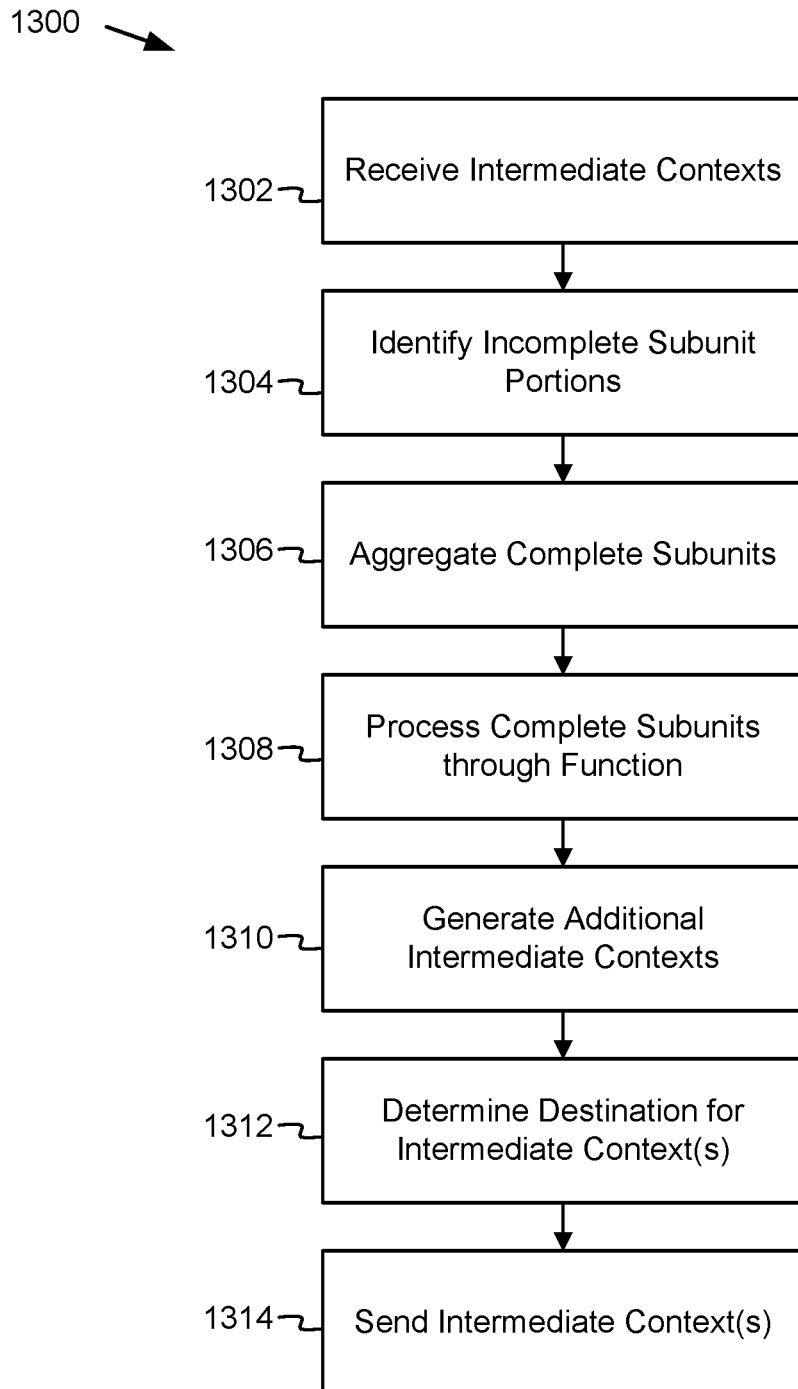
FIG. 13 illustrates an example method of function processing by aggregating incomplete subunits.

As shown in FIG. 13, the storage system 500 may be operated according to an example method of handling incomplete subunit portions in intermediate contexts, i.e. according to the method 1300 illustrated by the blocks 1302-1314 of FIG. 13.

At block 1302, intermediate contexts are received. For example, an incomplete subunit processor associated with a function coordinator or a storage node decoding a symbol containing an incomplete subunit portion may receive one or more intermediate contexts that include incomplete subunit portions.

At block 1304, at least two incomplete subunit portions may be identified. For example, incomplete subunit portions may be identified from multiple intermediate contexts or from at least one intermediate context and an incomplete subunit portion identified in the storage node.

At block 1306, the at least two incomplete subunit portions may be aggregated into a complete subunit. For example, multiple incomplete subunit portions may be identified as portions of the same subunit and concatenated in a portion order to form a complete subunit.

At block 1308, the complete subunits may be processed through a distributed function. For example, a function processor may be used to process the complete subunit as if it had been identified from a single symbol.

At block 1310, processing the complete subunits may generate additional intermediate contexts. For example, processing the complete subunit may generate an intermediate result that may be included in an intermediate context.

At block 1312, destinations for the intermediate contexts generated at block 1310 may be determined. For example, the storage controller initiating the function processing request, a next storage node for a serial processing of symbols, or a client system may be determined as destinations for intermediate contexts generated from completed symbols.

At block 1314, the intermediate contexts may be sent to the destination. For example, the incomplete subunit processor or an associated function processor may send the intermediate context to the destination determined at block 1312.

Figure 14:
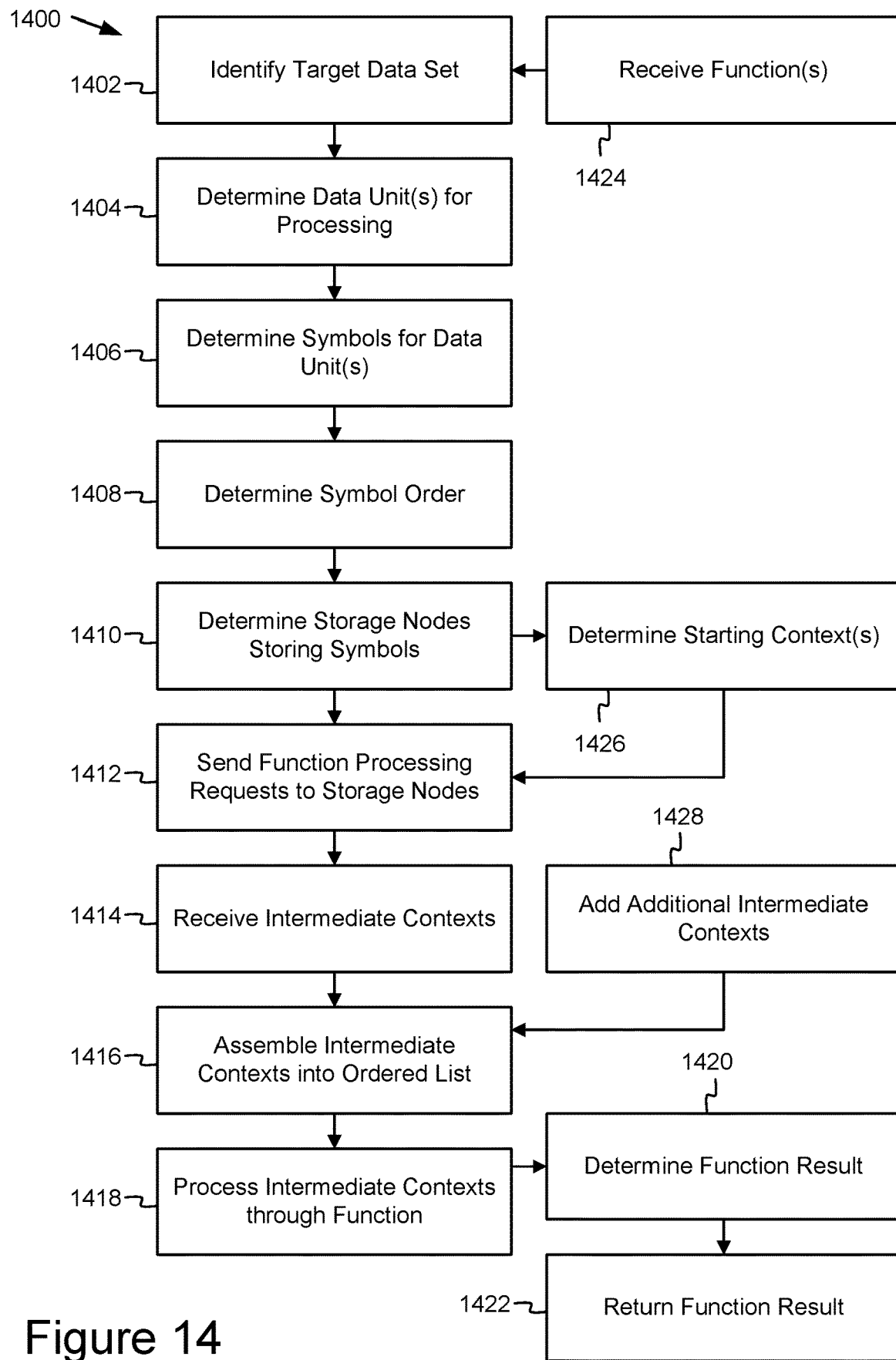
FIG. 14 illustrates an example method of coordinating function processing across storage nodes for a target data set.

As shown in FIG. 14, the storage system 500 may be operated according to an example method of distributed function process to return a function result, i.e. according to the method 1400 illustrated by the blocks 1402-1428 of FIG. 14.

At block 1402, a target data set may be identified. For example, a data function processing request may be received that defines a target data set for the function processing.

At block 1404, one or more data units may be determined from the target data set for processing. For example, the target data set may include boundaries or conditions for identifying the data units that make up the target data set.

At block 1406, the symbols that correspond to the data units in the target data set may be determined. For example, the data units may include one or more identifiers that may be used to search or index a data unit/symbol map and return a list of symbols corresponding to each data unit.

At block 1408, a symbol order may be determined for the symbols corresponding to a data unit. For example, the list of symbols may be provided in symbol order or may include indicators to place the symbols in an appropriate order corresponding to the order their contents appear in the data unit.

At block 1410, storage nodes storing each of the symbols may be determined. For example, the list of symbols returned from the data unit/symbol map may include a storage node identifier for the storage node storing each symbol.

At block 1412, function processing requests may be sent to each storage node that includes a target symbol. For example, a function processing request identifying the symbol to be processed may be addressed to each storage node based on their storage node identifier. The function processing request may also identify the function(s) to be used and/or provide a prior context, such as a starting context or intermediate context, to be used in the function processing.

At block 1414, intermediate contexts may be received from the storage nodes that were sent function processing requests. For example, the response message to the function processing request for each storage node may include an intermediate context that resulted from the function processing executed by that storage node.

At block 1416, intermediate contexts may be assembled into an ordered list. For example, the intermediate contexts may be assembled in symbol order to correspond to the order of subunits in the original data unit.

At block 1418, the intermediate contexts may be processed through a result function. For example, a reduce function may be applied to each intermediate context in list order and/or the aggregate intermediate results included in the ordered intermediate contexts.

At block 1420, a function result may be determined for the original data function processing request. For example, the output of the result function may be formatted in accordance with the requesting client system.

At block 1422, the function result may be returned to the client system. For example, the formatted function result from block 1420 may be sent to the client system in response to the data function processing request.

At block 1424, a function set may be received for the function data processing request. For example, a function set may be associated with the target data set in advance of the function data processing request (such as when configuring the data units for storage in the storage nodes) or may be included with the function data processing request.

At block 1426, one or more starting context may be determined prior to sending one or more function processing requests. For example, a first symbol may receive a starting context based on seed values in the function data processing request or a result value or intermediate context from a prior data unit.

At block 1428, one or more additional intermediate contexts may be added to the intermediate contexts received from the storage nodes. For example, an incomplete subunit processor may generate additional intermediate contexts from incomplete subunit portions identified in symbols processed by the storage nodes.

Figure 15:
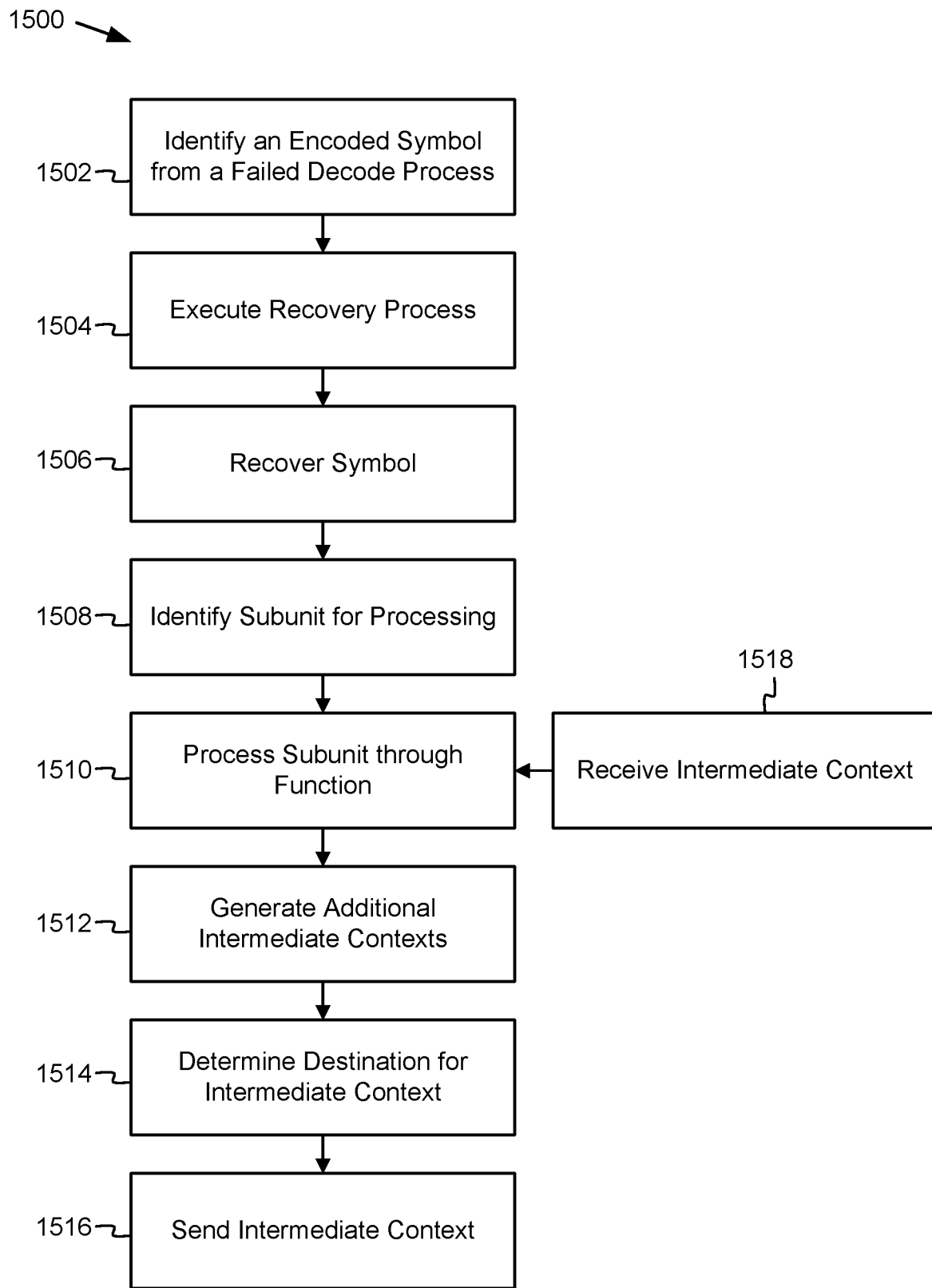
FIG. 15 illustrates an example method of function processing with symbol recovery.

As shown in FIG. 15, the storage system 500 may be operated according to an example method of recovering subunits for function processing after a failed decode process at a storage node, i.e. according to the method 1500 illustrated by the blocks 1502-1518 of FIG. 15.

At block 1502, an encoded symbol may be identified from a failed decode process. For example, a storage node that has failed to decode a target symbol may send a message and/or encoded symbol data to a symbol recovery engine.

At block 1504, a recovery process may be executed. For example, a symbol recovery engine may execute a series of retries, recovery techniques, and/or backup requests to recover the original (decoded) symbol data.

At block 1506, the original symbol may be recovered. For example, the recovery process at block 1504 may be successful and return the decoded symbol.

At block 1508, a subunit for processing may be identified from the decoded symbol. For example, a subunit function may be applied to identify a target subunit within the symbol data.

At block 1510, the subunit may be processed through a distributed function. For example, the identified subunit (and an intermediate context, if received) may be processed through a map or serial function.

At block 1512, additional intermediate contexts may be generated based on the output of the distributed function and the recovered symbol. For example, the function result of the distributed function may be included in an intermediate context.

At block 1514, a destination for the intermediate context may be determined. For example, the storage controller initiating the function processing request, a next storage node for a serial processing of symbols, or a client system may be determined as a destination.

At block 1516, the intermediate context may be sent to the destination. For example, the symbol recovery engine may send the intermediate context to the destination determined at block 1514.

At block 1518, an intermediate context may be received. For example, an intermediate context from processing a prior symbol and/or prior data unit associated with the target symbol of the failed decode process may be received by the symbol recovery engine for use at block 1510.

Figure 16:
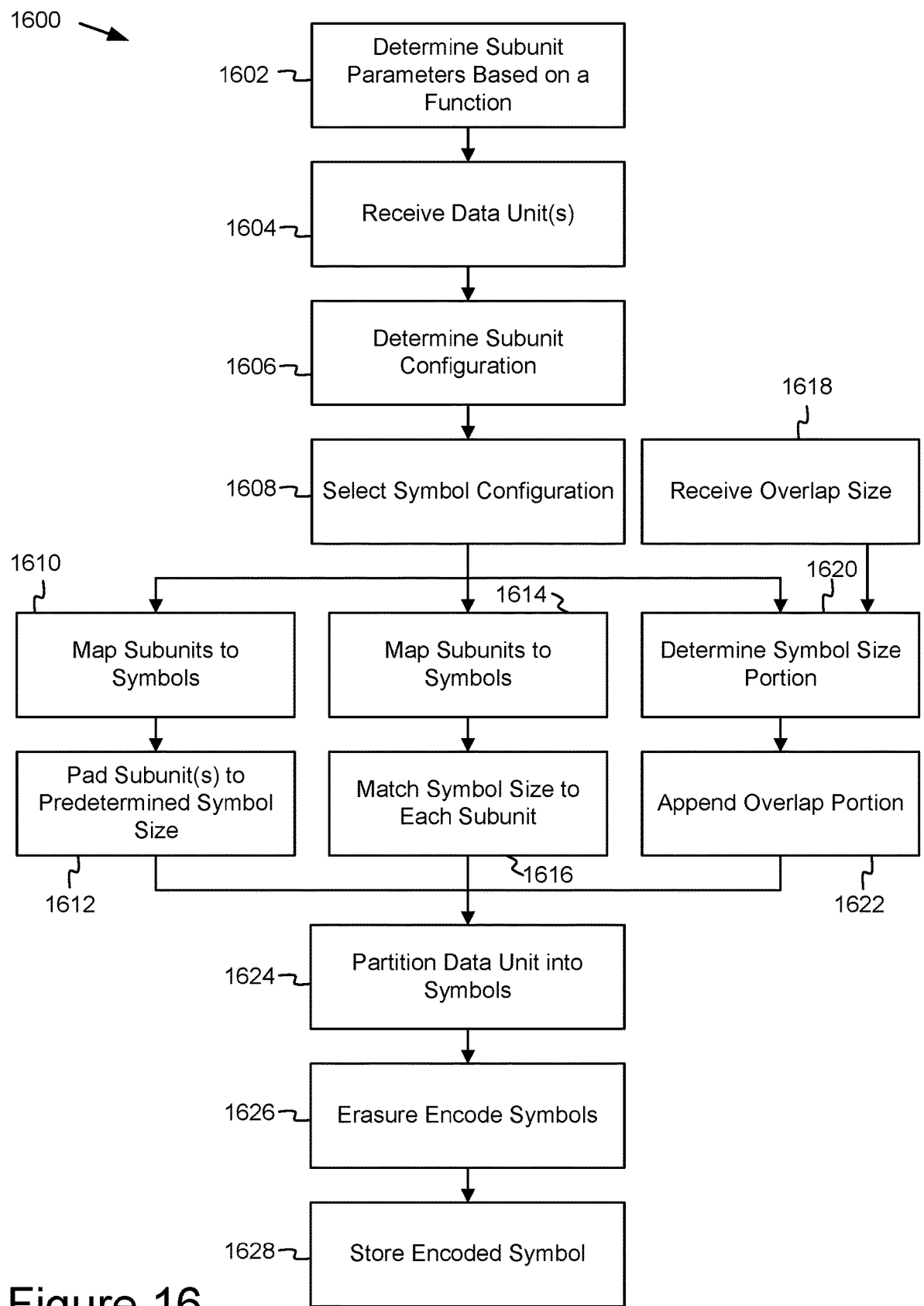
FIG. 16 illustrates an example method of symbol encoding to support function processing.

As shown in FIG. 16, the storage system 500 may be operated according to an example method of encoding subunits in symbols for distributed storage, i.e. according to the method 1600 illustrated by the blocks 1602-1628 of FIG. 16.

At block 1602, subunit parameters may be determined based on a subunit function or set of functions. For example, a subunit function may define boundary conditions and/or other detectable data structures within a data unit that define and separate subunits.

At block 1604, one or more data units are received for storage in accordance with the subunit function. For example, data units may be received from a client application in the normal course of using that application to capture and store data of a type associated with the function set (and likely to be subject to future data function processing requests).

At block 1606, a subunit configuration may be determined for a received data unit based on the subunit function. For example, data units may be processed through the subunit function to determine where the boundaries between adjacent subunits in the data unit are located.

At block 1608, a symbol configuration may be selected. For example, a storage system may support multiple encoding configurations for aligning subunits with symbols to be encoded and distributed among storage nodes. Selection of the symbol configuration may determine whether method 1600 proceeds to block 1610, 1614, or 1620.

At block 1610, subunits may be mapped to symbols, where symbol size may exceed subunit size. For example, symbol size may be selected to equal or exceed the largest subunit size in the data unit.

At block 1612, subunits may be padded to equal the predetermined symbol size. For example, where a subunit size is smaller than the predetermined symbol size null values or another filler pattern may be used to fill the difference and maintain the predetermined symbol size.

At block 1614, subunits may be mapped to symbols, where subunit size and/or symbol size may be varied to align subunits and symbols. For example, if subunit size or symbol size is configurable, subunits may be mapped to symbols on a one-to-one basis without wasted or redundant symbol data.

At block 1616, each symbol size may be matched to each subunit size. For example, subunit sizes may be held as fixed and symbols sizes may be selected to match or subunit sizes may be selected for the functions that align with an encoded block size for symbols in the storage system.

At block 1618, an overlap size may be received as part of the symbol configuration. For example, if a shingled symbol configuration is selected at block 1608, a default or user customized overlay data size may be received or determined.

At block 1620, a symbol size portion may be determined. For example, an encoded block size for the storage system may be used as the default symbol size portion.

At block 1622, an overlap data portion may be appended to the symbol size portion to determine a total size of the shingled symbol. For example, the symbol size and the overlap data portion may determine where each symbol corresponding to the data unit will start and how much overlap there will be across symbols.

At block 1624, the data unit may be partitioned into symbols. For example, starting from the first subunit in the data unit and proceeding until all data in the subunit has been partitioned into at least one symbol, symbols may be partitioned from the data unit in accordance with the symbol configuration selected in 1608 and the alignment of subunits to symbols in blocks 1610-1612, 1614-1616, and/or 1618-1622.

At block 1626, the original symbols may be encoded in to erasure encoded symbols. For example, each symbol may be passed to a storage node for encoding and storage and recorded in a data unit/symbol map.

At block 1628, the encoded symbols may be stored in their respective storage nodes. For example, each storage node may receive one or more symbols, encode them at block 1626, and write them to their local storage medium.

Figure 17:
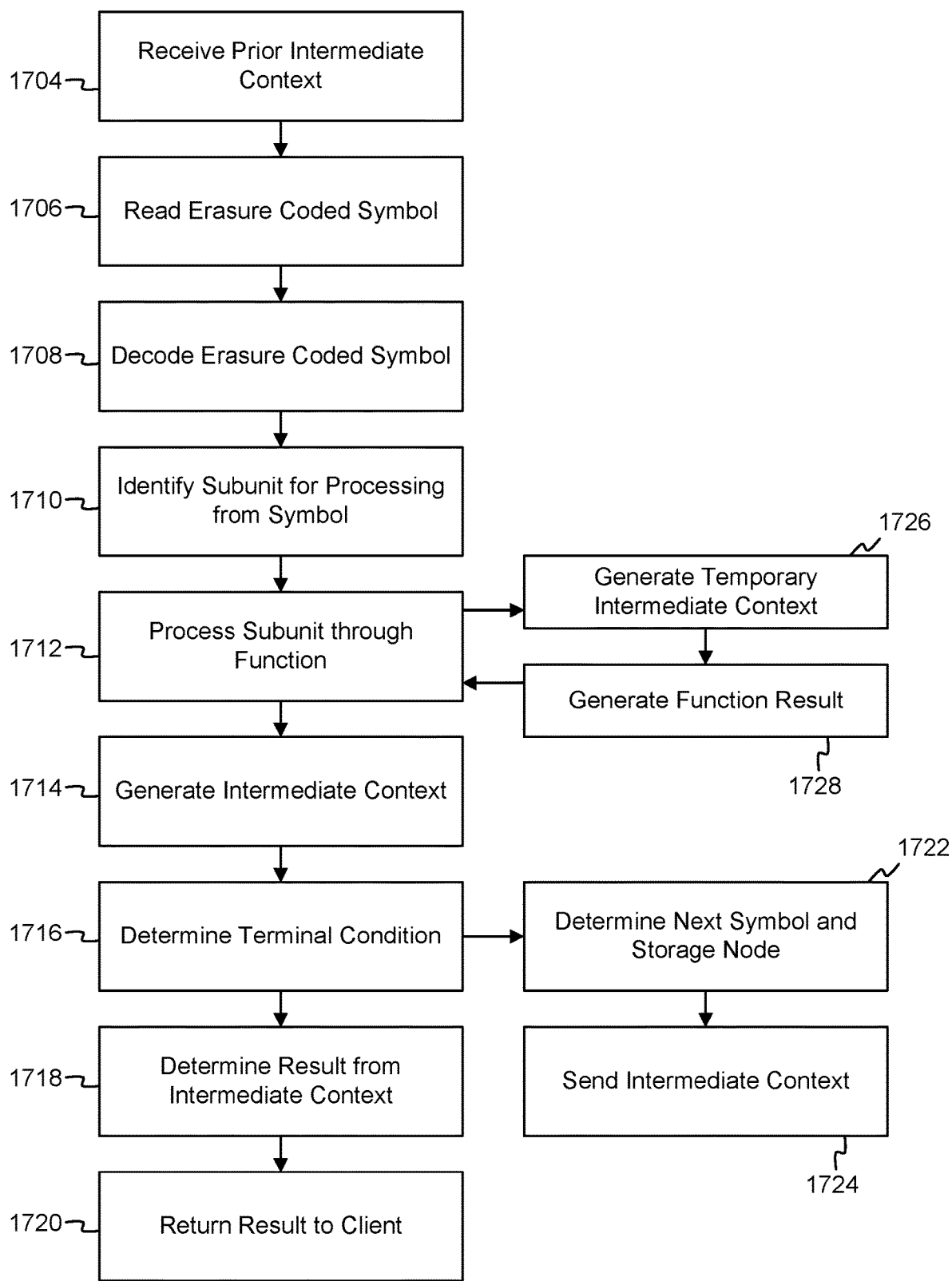
FIG. 17 illustrates an example method of function processing using serial operations between storage nodes.

As shown in FIG. 17, the storage system 500 may be operated according to an example method of distributed processing of serial data functions across multiple storage nodes, i.e. according to the method 1700 illustrated by the blocks 1702-1724 of FIG. 17.

At block 1704, a prior intermediate context may be received. For example, an intermediate context from processing a prior symbol and/or prior data unit may be received by a storage node.

At block 1706, an erasure coded symbol may be retrieved. For example, an erasure coded symbol corresponding to a target subunit for a data unit may be read from a local storage medium by the storage node.

At block 1708, the erasure coded symbol may be decoded. For example, a decode engine in the storage node may decode the erasure coded symbol to recover the original symbol.

At block 1710, a subunit for processing may be identified from the decoded symbol. For example, a subunit function may be applied to identify a target subunit within the symbol data at the storage node.

At block 1712, the subunit may be processed through a distributed function. For example, the prior intermediate context and the identified subunit may be processed through a serial-function by the storage node. In some embodiments, the serial-function may include map and reduce functions, described below with regard to block 1726 and 1728.

At block 1714, an intermediate context may be generated based on the output of the distributed function. For example, the function result of the distributed function may be included in an intermediate context by the storage node.

At block 1716, a terminal condition may be determined. For example, the subunit or symbol may be evaluated for whether it is the final or terminal subunit or symbol. If it is the terminal subunit or symbol, the terminal condition may be met and method 1700 may proceed to block 1718. If it is not the terminal subunit or symbol, the terminal condition is not met and method 1700 may proceed to block 1722.

At block 1718, a result may be determined from the last intermediate context. For example, the intermediate context generated at block 1714 may include a result value that may be determined to be the function result or may be further processed and/or formatted to determine the function result.

At block 1720, the function result may be returned to the client system. For example, the function result from block 1718 may be sent to the client system in response to the data function processing request.

At block 1722, a next symbol and associated storage node may be determined. For example, the next storage node for a serial processing of symbols may be determined as a destination by the storage node.

At block 1724, the intermediate context may be sent to the next storage node. For example, the storage node may send the intermediate context to the destination determined at block 1722.

At block 1726, a temporary intermediate context may be generated to support the processing at block 1712. For example, a map-function may be applied to the identified subunit to generate the temporary intermediate context.

At block 1728, the temporary intermediate context and the prior intermediate context may generate a function result. For example, a reduce-function may be applied to the temporary intermediate context and the prior intermediate context to generate the serial-function result that will be included in the intermediate context at block 1714.

Figure 18:
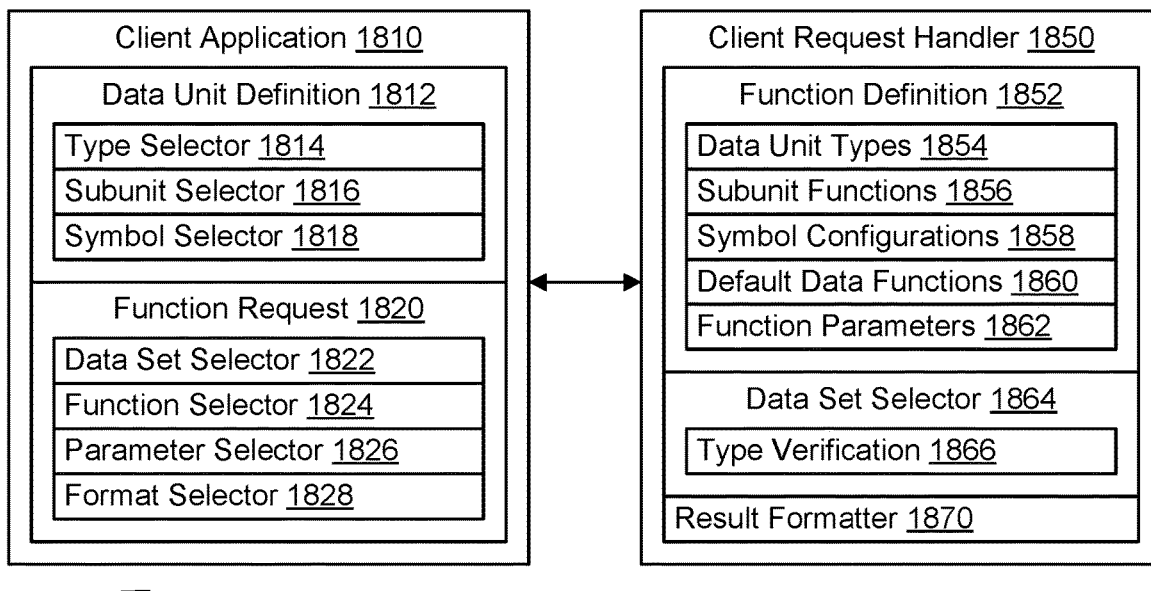
FIG. 18 schematically illustrates some example elements for interfacing with storage nodes of the distributed storage system of FIG. 1.

As shown in FIG. 18, a client application 1810, such as the client applications 610 in FIGS. 6 and 710 in FIG. 7, may communicate with a client request handler 1850, such as client request handler 522 in FIG. 5, to provide a user interface system 1800. These example subsystems or modules may be hosted by one or more nodes of distributed storage system 1 and be executed using the processors, memories, and other hardware and software components of those nodes. For example, client application 1810 may be hosted on client nodes 10.1-10.*n* and client request handler 1850 may be hosted on access nodes 20.1-20.*n* or storage nodes 30.1-30.40.

Client application 1810 may include a set of functions and parameters for providing a user interface, such as a graphical user interface, or API for managing some aspects of distributed storage system 1, such as data function processing. In the example shown, client application 1810 includes a data unit definition module 1812 and a function request module 1820.

Data unit definition module 1812 may include a set of function and parameters for enabling a user to identify and/or select various parameters of data units, such as data objects or files, that may be processed using one or more data functions. For example, client application 1810 may be configured to manage a specific subset of file formats or data object types that are used by client application 1810, such as a media server that supports specific video or audio data unit types or an predictive intelligence system that processes sensor data stored in particular CSV files or objects. In some embodiments, data unit definition module 1812 may include a type selector 1814, a subunit selector 1816, and a symbol selector 1818.

In some embodiments, data unit definition module 1812 may be descriptive in nature, enabling the user to describe the data unit types used by client application 1810 that may be used for data function processing. In some embodiments, data unit definition module 1812 may be proscriptive in nature, enabling the user to describe acceptable data unit types that are enforced by client application 1810 at a policy level to assure that data units stored to the storage system comply with the selected data unit types to enable data function processing.

Type selector 1814 may include functions, parameters, and/or logic for selecting or identifying a data unit type. For example, a file or object type may be selected from a table of file or object types supported by client application 1810 or a file or object definition utility may enable the selection of file or data object parameters, such as file size, headers, tagging, metadata, data structure, etc., associated with a defined file or object type.

Subunit selector 1816 may include functions, parameters, and/or logic for selecting or identifying relevant data structures within the data unit that may form the basis of subunits for data function processing. For example, data object containing markup language may include tags designating chapters and/or paragraphs of a novel and subunit selector 1816 may enable the user to identify the markup syntax relevant to subunits for the types of data functions intended to process those files. Subunits may be defined by subunit parameters that enable identification of boundary conditions for individual subunits. In some embodiments, selected file formats and object types may be supported by predefined subunit configurations and subunit selector 1816 may display the subunit parameters for the selected data type. In some embodiments, subunit selection may be supported by one or more markup and/or query languages that enable users to define boundary conditions within a data unit based on contents of those data units.

Symbol selector 1818 may include functions, parameters, and/or logic for selecting or identifying a symbol configuration that is compatible with the storage system and enables alignment with the subunits. For example, symbol selector 1818 may include varying patterns of symbol size and how they align with subunits in an example data unit of the data unit type and subunits selected. Symbol selector 1818 may support configuration of symbol size, overlap data length, and/or ranges for variable sizes and lengths. In some embodiments, symbol selector 1818 may provide a model of data storage usage and the likelihood of incomplete subunits that may need to be moved in order to complete processing.

In some embodiments, data unit definition module 1812 may generate a definition data structure, such as a configuration file or object, that may be used by client application 1810 and/or client request handler 1850 to store and access data unit definitions for use in processing write requests and/or data function requests. In some embodiments, a data unit definition may be included in metadata associated with the data unit.

Function request module 1820 may include a set of function and parameters for enabling a user to identify and/or select various parameters for a data function request to storage system 500. For example, function request 1820 may select parameters to be included in a data function request sent to client request handler 1850 for processing. In some embodiments, function request module 1820 may include a data set selector 1822, a function selector 1824, a parameter selector 1826, and a format selector 1828.

Data set selector 1822 may include functions, parameters, and/or logic for selecting or identifying a data set including one or more data units. For example, data set selector 1822 may provide a utility for selecting previously stored files or data objects for data function processing. In some embodiments, data set selector 1822 may indicate whether stored data units fit a data unit definition from data unit definition module 1812 and their level of compatibility with data function requests. Data set selector 1822 may enforce that only data units of the same or compatible data unit type be included in a data set together.

Function selector 1823 may include functions, parameters, and/or logic for selecting or identifying one or more data functions or function sets for processing the data set. For example, a selected data set may include a data unit type that is compatible with a set of predefined function types, such as map-reduce functions with defined subunit, map, and reduce functions. A user may select a function from among the predefined function types compatible with the selected data set. In some embodiments, the storage system may only support a single function for a given data unit type and the function may be identified and automatically selected.

A data function, more specifically a distributed data function, may include any data processing task or process to be executed against the subunits of a data unit that return function results based on the contents of the symbol data, which may include metadata tags. A predefined data function may include a distributed data function defined by the storage system to support distributed processing at the storage nodes, which may be embodied in function definitions in the storage system, such as described with regard to function definition module 1852 below. In some embodiments, predefined data functions may accept one or more function parameters for customizing their use to a specific data processing task. Function parameters may include argument parameters, such as ranges, thresholds, seed values, or other variables for a predefined data function that modify how data parameters or contents of the subunits are selected, counted, aggregated, or otherwise transformed into a function result. In some embodiments, function parameters may support complex logical parameters defined through a language syntax, such as structured query language (SQL). For example, a predefined data function may include SQL processing support for a defined command set supported by the contents and syntax of a data unit type. Function selector 1824 may enable selection of the SQL function for querying the data unit type. The SQL function type may include a default query syntax for a specific SQL query against the data unit type and/or may include a field for receiving a custom query based on the available command and data target set for the data unit as a function parameter.

Parameter selector 1826 may include functions, parameters, and/or logic for selecting function parameters for a selected function. For example, a selected function may include one or more seed values, constants, units of measurement, subfunctions for statistical values, etc. that are configurable through function parameters.

Format selector 1828 may include functions, parameters, and/or logic for selecting a return format for the result data from processing the data function request. For example, a selected function may support different output formats, data structures, and/or locations for the returned function data.

Client request handler 1810 may include a set of functions and parameters for receiving, parsing, and issuing further commands within the storage system to execute storage and data function requests. For example, client request handler 1810 may be configured similarly to client request handler 522 in FIG. 5. In the example shown, client request handler 1850 includes a function definition module 1852, a data set selector 1864, and a result formatter 1870.

Function definition module 1852 may include a set of function and parameters for identifying storage and function parameters for supporting storage node processing of data functions. For example, function definition module 1852 may maintain a lookup table or other data structure for cross-referencing data unit types with supported predefined functions and supporting symbol configurations. Function definition module 1852 may be configured similarly to function definition module 522.1 in FIG. 5. In some embodiments, function definition module 1852 may include data unit types 1854, subunit functions 1856, symbol configurations 1858, default data functions 1860, and function parameters 1862.

In some embodiments, data unit type 1854 may include a set of unique identifiers for data unit types that act as an index for other aspects of a predefined function definition. For example, data unit types 1854 may include standard data unit types, such as file formats and object types, that are supported by the storage system. In some embodiments, custom data unit types may also be supported based on data unit definitions and function configurations received from client application 1810.

In some embodiments, subunit functions 1856, symbol configurations 1858, default data functions 1860, and function parameters 1862 may be determined by data unit type 1854. Based on the data unit type, function definition module 1852 may: identify a subunit function for function processing from subunit functions 1856 that is compatible with the subunit parameters of the data unit type; identify a symbol configuration for data unit storage from symbol configurations 1858 that is compatible with subunit parameters of the data unit type; identify a default data processing function (map-function, serial-function, reduce-function, etc.) for function processing from default data functions 1860, and identify any necessary or customizable function parameters for function processing from function parameters 1862. These functions and parameters may be used by other subsystems, such as encoding/decoding engines, function processors, function coordinators, etc., to complete storage and function processing tasks.

Data set selector 1864 may be configured similarly to data set selector 522.2 in FIG. 5. For example, data set selector 1864 may identify a target data set from a data function request received from client application 1810. In some embodiments, data set selector 1864 may identify the data unit type from the selected data set and the identified data unit type may be used to index the function definitions in function definition module 1852. In the example shown, data set selector 1864 may also include data type verification 1866 for verifying that the selected data set includes a data type that is compatible with at least one function definition and/or function parameters included in the data function request.

Result formatter 1870 may be configured similarly to result formatter 522.3 in FIG. 5. Result formatter 1870 may parse any format selection parameters received in the data function request.

Figure 19:
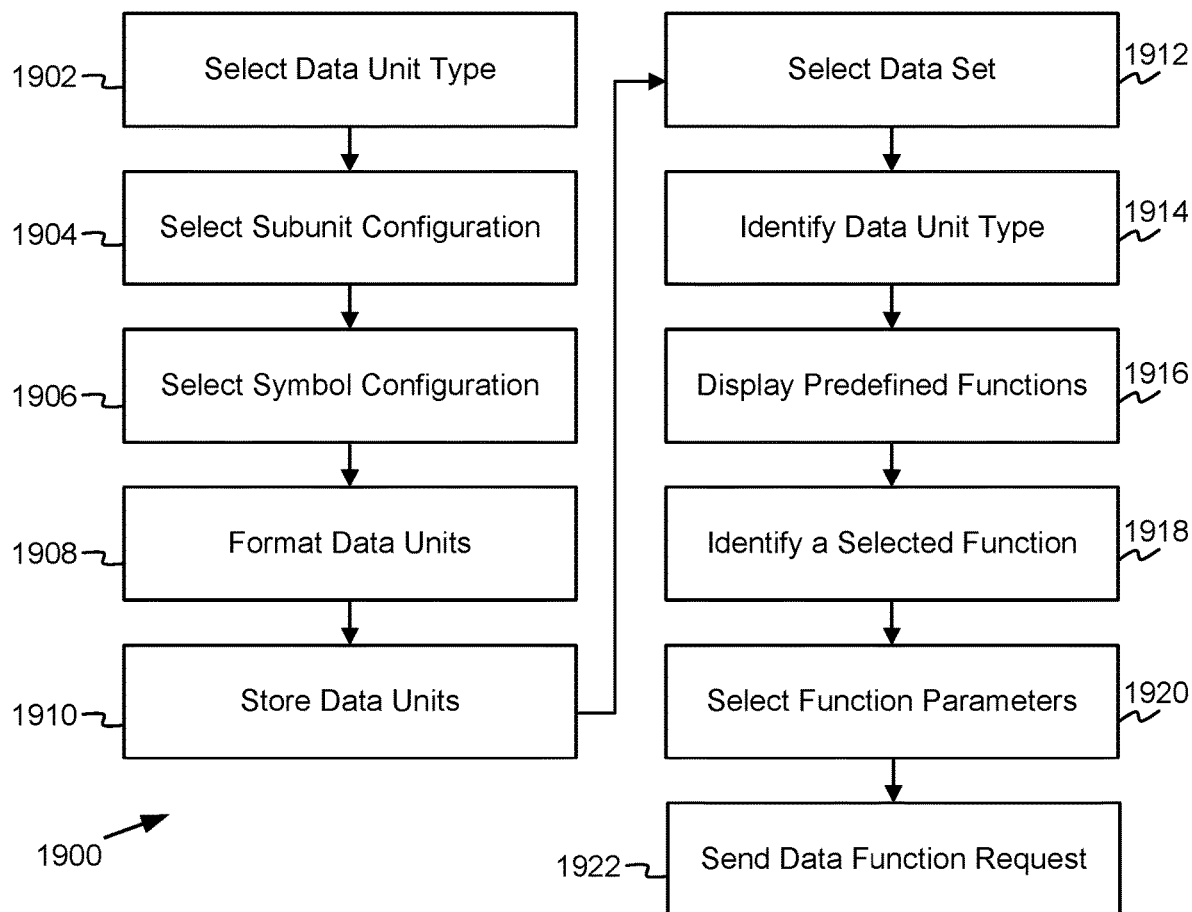
FIG. 19 illustrates an example method of configuring a data function request.

As shown in FIG. 19, the user interface system 1800 and/or storage system 500 may be operated according to an example method of generating a data function request, i.e. according to the method 1900 illustrated by the blocks 1902-1922 of FIG. 19.

At block 1902, a data unit type may be selected. For example, a data unit type supported by a client application may be selected for configuration to be compatible with data function processing at the storage nodes.

At block 1904, a subunit configuration may be selected for the data unit type. For example, the subunit parameters for identifying subunit boundaries may be selected or identified from the data unit type.

At block 1906, a symbol configuration may be selected for the data unit type. For example, based on the data unit type and the subunit configuration a preferred symbol configuration may be selected.

At block 1908, data units may be formatted in accordance with the data unit type and subunit configuration. For example, as the client application is used in production and stores relevant data, it may be formatted into data structures and syntax matching the data unit type and subunit configuration.

At block 1910, data units are stored to the storage system. For example, the client application may issue write commands for the formatted data units to a storage system configured to identify the data unit type and store the data units using the selected symbol configuration.

At block 1912, a data set may be selected for a data function request. For example, a subset of data units with a common data unit type may be selected for data function processing.

At block 1914, the data unit type of the data units in the data set may be identified. For example, the data unit type may be included as a parameter of the data function request or be identifiable from the data units themselves (header, tag, naming convention, etc.) or related metadata.

At block 1916, one or more predefined functions are displayed based on the identified unit type. For example, a particular graphics file format may support three predefined map-reduce functions on the storage system.

At block 1918, a selected function is identified from the set of predefined functions. For example, a user may use an input device to select the predefined map-reduce function of interest for the data function request.

At block 1920, any parameters for the selected function may be selected. For example, the selected function may include a based value or configurable threshold for processing the data set.

At block 1922, a data function request may be sent to the storage system. For example, parameters representing the selections made in blocks 1912-1920 may be populated in a client request message to the client request handler.

Figure 20:
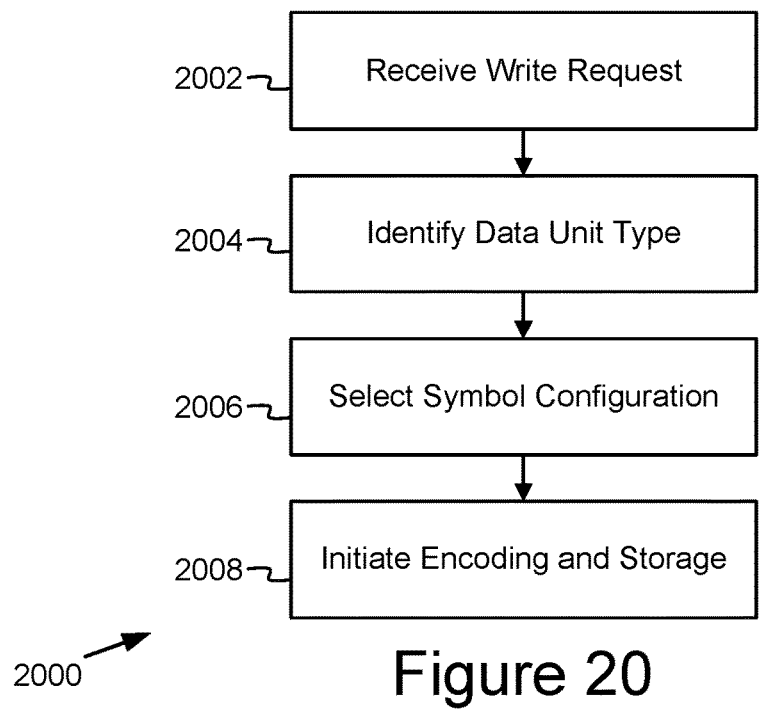
FIG. 20 illustrates an example method of initiating encoding and storage.

As shown in FIG. 20, the user interface system 1800 and/or storage system 500 may be operated according to an example method of initiating encoding and storage compatible with function processing in response to a write request, i.e. according to the method 2000 illustrated by the blocks 2002-2008 of FIG. 20.

At block 2002, a write request may be received. For example, a write request may be received from a client system that includes a data unit with a data unit type compatible with a function definition in the storage system.

At block 2004, a data unit type may be identified in response to the write request. For example, the write request may specify the data unit type and/or the data unit may include indicia of data unit type.

At block 2006, a symbol configuration may be selected. For example, the data unit type may be used to identify a symbol configuration based on the write request and/or cross-referencing the data unit type with a function definition that includes at least one compatible symbol configuration.

At block 2008, encoding and storage of the data unit in the write request may be initiated. For example, the data unit and the symbol configuration may be passed to an encoding engine for partitioning, encoding, and storage distributed across a plurality of storage nodes. In some embodiments, initiating encoding and storage may include execution of some portion of method 1600 in FIG. 6.

Figure 21:
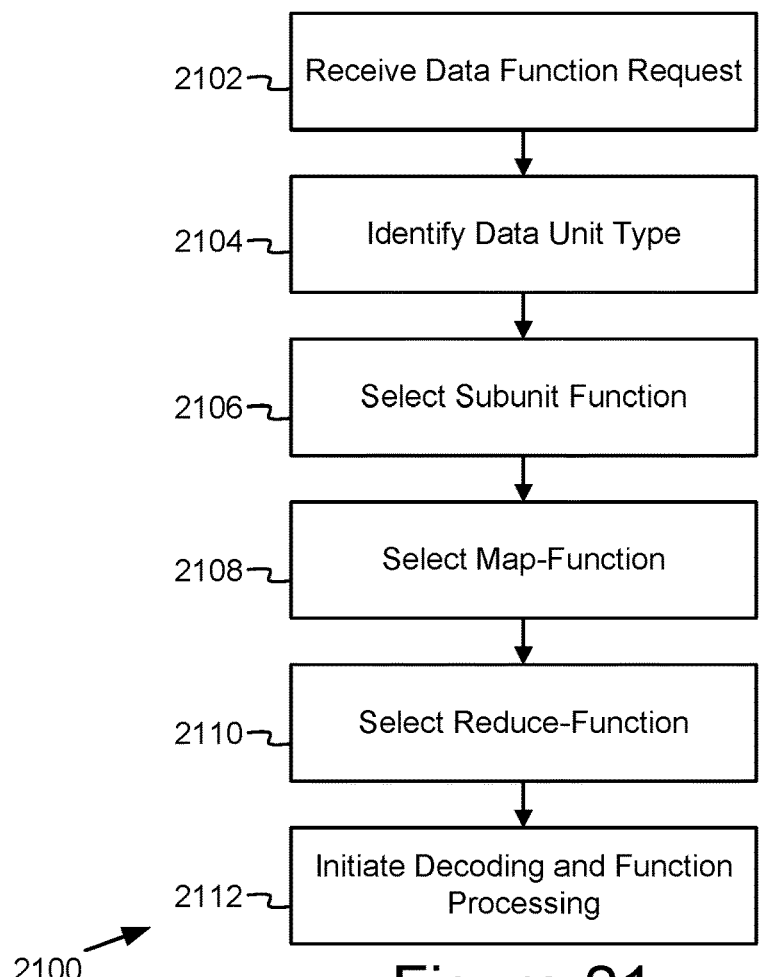
FIG. 21 illustrates an example method of initiating decoding and function processing.

As shown in FIG. 21, the user interface system 1800 and/or storage system 500 may be operated according to an example method of initiating decoding and function processing in response to a data function request, i.e. according to the method 2100 illustrated by the blocks 2102-2112 of FIG. 20.

At block 2102, a data function request may be received. For example, a data function request may be received from a client system that identifies a data set with one or more data units, such as a list of unique identifiers associated with the data units, with a data unit type compatible with a function definition in the storage system.

At block 2104, a data unit type may be identified in response to the data function request. For example, the data function request may specify the data unit type, the data units may include indicia of data unit type, and/or the storage system may maintain metadata on stored data units that includes data unit type.

At block 2106, a subunit function may be selected based on the data unit type. For example, the data unit type may be used to index a function definition that includes a subunit function that may be executed be each storage node on the symbols it contains that correspond to the data unit and identify the subunits they contain.

At block 2108, a map-function may be selected based on the data unit type. For example, the data unit type may be used to index the function definition that includes a map-function or similar serial and/or distributed function that may be executed by each storage node on the symbols it contains that correspond to the data unit.

At block 2110, a reduce-function may be selected based on the data unit type. For example, the data unit type may be used to index the function definition that include a reduce-function or similar aggregator function that may be executed on intermediate results generated be the storage nodes.

At block 2112, decoding and function processing of the data units in the data set for the data function request may be initiated. For example, the data unit identifiers and the function set may be passed to a function coordinator and/or the storage nodes containing the symbols corresponding to the data units.

While at least one exemplary embodiment has been presented in the foregoing detailed description of the technology, it should be appreciated that a vast number of variations may exist. It should also be appreciated that an exemplary embodiment or exemplary embodiments are examples, and are not intended to limit the scope, applicability, or configuration of the technology in any way. Rather, the foregoing detailed description will provide those skilled in the art with a convenient road map for implementing an exemplary embodiment of the technology, it being understood that various modifications may be made in a function and/or arrangement of elements described in an exemplary embodiment without departing from the scope of the technology, as set forth in the appended claims and their legal equivalents.

As will be appreciated by one of ordinary skill in the art, various aspects of the present technology may be embodied as a system, method, or computer program product. Accordingly, some aspects of the present technology may take the form of an entirely hardware embodiment, an entirely software embodiment (including firmware, resident software, micro-code, etc.), or a combination of hardware and software aspects that may all generally be referred to herein as a circuit, module, system, and/or network. Furthermore, various aspects of the present technology may take the form of a computer program product embodied in one or more computer-readable mediums including computer-readable program code embodied thereon.

Any combination of one or more computer-readable mediums may be utilized. A computer-readable medium may be a computer-readable signal medium or a physical computer-readable storage medium. A physical computer readable storage medium may be, for example, but not limited to, an electronic, magnetic, optical, crystal, polymer, electromagnetic, infrared, or semiconductor system, apparatus, or device, etc., or any suitable combination of the foregoing. Non-limiting examples of a physical computer-readable storage medium may include, but are not limited to, an electrical connection including one or more wires, a portable computer diskette, a hard disk, random access memory (RAM), read-only memory (ROM), an erasable programmable read-only memory (EPROM), an electrically erasable programmable read-only memory (EEPROM), a Flash memory, an optical fiber, a compact disk read-only memory (CD-ROM), an optical processor, a magnetic processor, etc., or any suitable combination of the foregoing. In the context of this document, a computer-readable storage medium may be any tangible medium that can contain or store a program or data for use by or in connection with an instruction execution system, apparatus, and/or device.

Computer code embodied on a computer-readable medium may be transmitted using any appropriate medium, including but not limited to, wireless, wired, optical fiber cable, radio frequency (RF), etc., or any suitable combination of the foregoing. Computer code for carrying out operations for aspects of the present technology may be written in any static language, such as the C programming language or other similar programming language. The computer code may execute entirely on a user's computing device, partly on a user's computing device, as a stand-alone software package, partly on a user's computing device and partly on a remote computing device, or entirely on the remote computing device or a server. In the latter scenario, a remote computing device may be connected to a user's computing device through any type of network, or communication system, including, but not limited to, a local area network (LAN) or a wide area network (WAN), Converged Network, or the connection may be made to an external computer (e.g., through the Internet using an Internet Service Provider).

Various aspects of the present technology may be described above with reference to flowchart illustrations and/or block diagrams of methods, apparatus, systems, and computer program products. It will be understood that each block of a flowchart illustration and/or a block diagram, and combinations of blocks in a flowchart illustration and/or block diagram, can be implemented by computer program instructions. These computer program instructions may be provided to a processing device (processor) of a general purpose computer, special purpose computer, or other programmable data processing apparatus to produce a machine, such that the instructions, which can execute via the processing device or other programmable data processing apparatus, create means for implementing the operations/acts specified in a flowchart and/or block(s) of a block diagram.

Some computer program instructions may also be stored in a computer-readable medium that can direct a computer, other programmable data processing apparatus, or other device(s) to operate in a particular manner, such that the instructions stored in a computer-readable medium to produce an article of manufacture including instructions that implement the operation/act specified in a flowchart and/or block(s) of a block diagram. Some computer program instructions may also be loaded onto a computing device, other programmable data processing apparatus, or other device(s) to cause a series of operational steps to be performed on the computing device, other programmable apparatus or other device(s) to produce a computer-implemented process such that the instructions executed by the computer or other programmable apparatus provide one or more processes for implementing the operation(s)/act(s) specified in a flowchart and/or block(s) of a block diagram.

A flowchart and/or block diagram in the above figures may illustrate an architecture, functionality, and/or operation of possible implementations of apparatus, systems, methods, and/or computer program products according to various aspects of the present technology. In this regard, a block in a flowchart or block diagram may represent a module, segment, or portion of code, which may comprise one or more executable instructions for implementing one or more specified logical functions. It should also be noted that, in some alternative aspects, some functions noted in a block may occur out of an order noted in the figures. For example, two blocks shown in succession may, in fact, be executed substantially concurrently, or blocks may at times be executed in a reverse order, depending upon the operations involved. It will also be noted that a block of a block diagram and/or flowchart illustration or a combination of blocks in a block diagram and/or flowchart illustration, can be implemented by special purpose hardware-based systems that may perform one or more specified operations or acts, or combinations of special purpose hardware and computer instructions.

While one or more aspects of the present technology have been illustrated and discussed in detail, one of ordinary skill in the art will appreciate that modifications and/or adaptations to the various aspects may be made without departing from the scope of the present technology, as set forth in the following claims.

What is claimed is:

1. A system, comprising:
a first plurality of storage nodes, wherein:
  each storage node of the first plurality of storage nodes includes a non-transitory storage medium configured to store at least one erasure encoded symbol for a data unit;
  the first plurality of storage nodes is configured to receive a data function request targeting the data unit with a serial-function;
  at least one storage node of the first plurality of storage nodes is configured to:
    determine at least a portion of the serial-function targeting the data unit;
    receive a prior intermediate context from a prior storage node of the first plurality of storage nodes;
    decode a second erasure encoded symbol from the non-transitory storage medium into a decoded second symbol for the data unit;
    identify a decoded second target subunit from the decoded second symbol;
    process, using the serial-function, the decoded second target subunit and the prior intermediate context to generate a next intermediate context; and
    send the next intermediate context to a next storage node of the first plurality of storage nodes;
a first storage node of the first plurality of storage nodes, wherein the first storage node includes a first non-transitory storage medium and is configured to:
  decode a first erasure encoded symbol from the first non-transitory storage medium into a decoded first symbol for a data unit, wherein the decoded first symbol includes a decoded first target subunit of the data unit;
  identify the decoded first target subunit in the decoded first symbol;
  process the decoded first target subunit using the serial-function to generate a first intermediate context; and
  send the first intermediate context to the next storage node of the first plurality of storage nodes as a first prior intermediate context; and
a final storage node of the first plurality of storage nodes, wherein the final storage node includes a second non-transitory storage medium and is configured to:
  decode a final erasure encoded symbol from the second non-transitory storage medium into a decoded final symbol for the data unit, wherein the decoded final symbol includes a decoded final target subunit of the data unit;
  identify the decoded final target subunit in the decoded final symbol;
  process the decoded final target subunit and a final prior intermediate context using the serial-function to generate a serial-function result for the data unit; and
  return the serial-function result.

2. The system of claim 1, wherein the serial-function includes:
a map-function, wherein the map-function is configured to generate a temporary intermediate context for the decoded final target subunit; and
a reduce-function, wherein the reduce-function is configured to generate the serial-function result from the temporary intermediate context and the final prior intermediate context.

3. The system of claim 1, wherein at least one storage node of the first plurality of storage nodes is further configured to:
receive at least a portion of the serial-function from the prior storage node of the first plurality of storage nodes; and
send at least a portion of the serial-function to the next storage node of the first plurality of storage nodes.

4. The system of claim 1, further comprising:
a second plurality of storage nodes configured to:
store a plurality of erasure encoded symbols corresponding to a prior data unit targeted by the serial-function;
generate, using the serial-function, at least one intermediate context from an erasure encoded symbol of the plurality of erasure encoded symbols corresponding to the prior data unit; and
send a prior data unit intermediate context to the first storage node of the first plurality of storage nodes, wherein the first storage node is further configured to use the prior data unit intermediate context to process the decoded first target subunit.

5. The system of claim 1, further comprising:
an incomplete subunit processor configured to:
receive an incomplete subset of intermediate contexts from the first plurality of storage nodes, wherein the incomplete subset of intermediate contexts includes incomplete subunits;
aggregate at least one complete target subunit from the incomplete subunits;
process the at least one complete target subunit using the serial-function and a prior intermediate context to generate at least one additional intermediate context; and
send the at least one additional intermediate context to the next storage node including a next symbol for the data unit.

6. The system of claim 1, wherein:
the decoded first symbol further includes a decoded first incomplete subunit;
the first intermediate context further includes the decoded first incomplete subunit; and
the next storage node of the first plurality of storage nodes is configured to identify a decoded next target subunit in a decoded next symbol from a combination of the decoded next symbol and the decoded first incomplete subunit.

7. The system of claim 1, wherein:
at least one storage node of the first plurality of storage nodes includes a peer communication channel to the prior storage node and the next storage node of the first plurality of storage nodes; and
at least one storage node of the first plurality of storage nodes is further configured to:
receive, from the prior storage node, the prior intermediate context via the peer communication channel; and
send, to the next storage node, the next intermediate context via the peer communication channel.

8. The system of claim 1, wherein:
the at least one erasure encoded symbol of each storage node of the first plurality of storage nodes is an ordered symbol among a plurality of symbols corresponding to the data unit, wherein the plurality of symbols have a symbol order;
the decoded first symbol is a first symbol in the symbol order;
the final decoded symbol is a terminal symbol in the symbol order; and
the serial-function result from the final storage node includes a final result returned to a client system.

9. The system of claim 1, further comprising:
a client request handler configured to:
receive the data function request;
identify a function data set including the data unit, wherein the first storage node and the final storage node are among the first plurality of storage nodes; and
return a function result based on the serial-function result to a client system, wherein the client system is not among the first plurality of storage nodes.

10. A computer-implemented method, comprising:
determining, based on a data function request, a serial-function;
decoding, at a first storage node including a first non-transitory storage medium, a first erasure encoded symbol from the first non-transitory storage medium into a decoded first symbol for a data unit, wherein the decoded first symbol includes a decoded first target subunit of the data unit;
identifying, at the first storage node, the decoded first target subunit in the decoded first symbol; and
processing, at the first storage node, the decoded first target subunit using the serial-function to generate a first intermediate context, wherein the first intermediate context includes a first function result;
sending the first intermediate context to a next storage node of a first plurality of storage nodes as a first prior intermediate context;
receiving, at each next storage node of the first plurality of storage nodes, a prior intermediate context from a prior storage node of the first plurality of storage nodes;
decoding, at that next storage node of the first plurality of storage nodes and from a non-transitory storage medium of that next storage node, a second erasure encoded symbol into a decoded second symbol for the data unit;
identifying, at that next storage node, a decoded second target subunit from the decoded second symbol;
processing, using the serial-function, the decoded second target subunit and the prior intermediate context to generate a next intermediate context;
sending the next intermediate context to another next storage node of the first plurality of storage nodes to provide the prior intermediate context for that another next storage node;
decoding, at a final storage node including a second non-transitory storage medium, a final erasure encoded symbol from the second non-transitory storage medium into a decoded final symbol for the data unit, wherein the decoded final symbol includes a decoded final target subunit of the data unit;
identifying, at the final storage node, the decoded final target subunit in the decoded final symbol;

processing, at the final storage node, the decoded final target subunit and a final prior intermediate context using the serial-function to generate a serial-function result; and returning the serial-function result.

11. The computer-implemented method of claim 10, further comprising:
receiving, by at least one storage node of the first plurality of storage nodes, at least a portion of the serial-function from the prior storage node of the first plurality of storage nodes; and
sending, by at least one storage node of the first plurality of storage nodes, at least a portion of the serial-function to the next storage node of the first plurality of storage nodes.

12. The computer-implemented method of claim 10, further comprising:
storing, by a second plurality of storage nodes, a plurality of erasure encoded symbols corresponding to a prior data unit targeted by the serial-function;
generating, using the serial-function, at least one intermediate context from an erasure encoded symbol of the plurality of erasure encoded symbols corresponding to the prior data unit; and
sending a prior data unit intermediate context to the first storage node of the first plurality of storage nodes, wherein the first storage node is further configured to use the prior data unit intermediate context to process the decoded first target subunit.

13. The computer-implemented method of claim 10, further comprising:
identifying an incompletely recovered erasure encoded symbol from a failed storage node decode operation in the first plurality of storage nodes;
executing a recovery process for the incompletely recovered erasure encoded symbol to determine a recovered subunit of the data unit;
processing the recovered subunit using the serial-function and a prior intermediate context to generate at least one additional intermediate context; and
sending the at least one additional intermediate context to the next storage node including a next symbol for the data unit.

14. The computer-implemented method of claim 10, further comprising:
receiving an incomplete subset of intermediate contexts from the first plurality of storage nodes, wherein the incomplete subset of intermediate contexts includes incomplete subunits;
aggregating at least one complete target subunit from the incomplete subunits;
processing the at least one complete target subunits using the serial-function and a prior intermediate context to generate at least one additional intermediate context; and
sending the at least one additional intermediate context to the next storage node including a next symbol for the data unit.

15. The computer-implemented method of claim 10, wherein:
the decoded first symbol further includes a decoded first incomplete subunit;
the first intermediate context further includes the decoded first incomplete subunit; and
the next storage node of the first plurality of storage nodes identifies a decoded next target subunit in a decoded next symbol from a combination of the decoded next symbol and the decoded first incomplete subunit.

16. The computer-implemented method of claim 10, wherein:
at least one storage node of the first plurality of storage nodes includes a peer communication channel to the prior storage node and the next storage node of the first plurality of storage nodes;
receiving, by at least one storage node of the first plurality of storage nodes, the prior intermediate context is via the peer communication channel; and
sending, by at least one storage node of the first plurality of storage nodes, the next intermediate context is via the peer communication channel.

17. The computer-implemented method of claim 10, wherein:
at least one erasure encoded symbol of each storage node of the first plurality of storage nodes is an ordered symbol among a plurality of symbols corresponding to the data unit, wherein the plurality of symbols have a symbol order;
the decoded first symbol is a first symbol in the symbol order;
the final decoded symbol is a terminal symbol in the symbol order; and
the serial-function result from the final storage node includes a final result returned to a client system.

18. The computer-implemented method of claim 10, further comprising:
receiving the data function request;
identifying a function data set including the data unit, wherein the first storage node and the final storage node are among the first plurality of storage nodes; and
returning a function result based on the serial-function result to a client system, wherein the client system is not among the first plurality of storage nodes.

19. A system, comprising:
a plurality of storage nodes, wherein each storage node of the plurality of storage nodes includes a non-transitory storage medium configured to store at least one erasure encoded symbol from a plurality of erasure encoded symbols for a data unit, and including:
a first storage node including a first non-transitory storage medium; and
a final storage node including a second non-transitory storage medium;
means for determining, based on a data function request, a serial-function;
means for decoding, at the first storage node, a first erasure encoded symbol from the first non-transitory storage medium into a decoded first symbol for a data unit, wherein the decoded first symbol includes a decoded first target subunit of the data unit;
means for identifying, at the first storage node, the decoded first target subunit in the decoded first symbol;
means for processing, at the first storage node, the decoded first target subunit using the serial-function to generate a first intermediate context;
means for sending the first intermediate context to a next storage node of the plurality of storage nodes as a first prior intermediate context;
means for receiving, at each next storage node of the plurality of storage nodes, a prior intermediate context from a prior storage node of the plurality of storage nodes;
means for decoding, at that next storage node of the plurality of storage nodes and from a non-transitory storage medium of that next storage node, a second erasure encoded symbol into a decoded second symbol for the data unit;

means for identifying, at that next storage node, a decoded second target subunit from the decoded second symbol;

means for processing, using the serial-function, the decoded second target subunit and the prior intermediate context to generate a next intermediate context;

means for sending the next intermediate context to another next storage node of the plurality of storage nodes to provide the prior intermediate context for that another next storage node;

means for decoding, at the final storage node, a final erasure encoded symbol from the second non-transitory storage medium into a decoded final symbol for the data unit, wherein the decoded final symbol includes a decoded final target subunit of the data unit;

means for identifying, at the final storage node, the decoded final target subunit in the decoded final symbol;

means for processing, at the final storage node, the decoded final target subunit and a final prior intermediate context using the serial-function to generate a serial-function result; and means for returning the serial-function result.

20. The system of claim 19, wherein:

the decoded first symbol further includes a decoded first incomplete subunit;

the first intermediate context further includes the decoded first incomplete subunit; and the means for identifying, at the next storage node of the plurality of storage nodes, identifies a decoded next target subunit in the decoded next symbol from a combination of the decoded next symbol and the decoded first incomplete subunit.

* * * * *